United States Patent
Takagi et al.

(10) Patent No.: US 7,687,803 B2
(45) Date of Patent: Mar. 30, 2010

(54) SEMICONDUCTOR DEVICE AND METHOD FOR MANUFACTURING SEMICONDUCTOR DEVICE

(75) Inventors: Naohiro Takagi, Kanagawa (JP); Yasuhiro Suzuki, Kanagawa (JP); Kazuaki Satou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 598 days.

(21) Appl. No.: 11/448,721

(22) Filed: Jun. 8, 2006

(65) Prior Publication Data

US 2006/0279315 A1  Dec. 14, 2006

(30) Foreign Application Priority Data

Jun. 9, 2005 (JP) .............................. 2005-169936

(51) Int. Cl.
  *H01L 23/58* (2006.01)
(52) U.S. Cl. .................... 257/48; 257/693; 257/737; 257/773; 257/777; 257/778; 257/E23.015; 257/E23.02; 257/E23.021; 257/E23.178; 257/E23.179; 257/E21.524; 324/675
(58) Field of Classification Search ............... 257/666, 257/673, 777, 778, 779, 780, 676, 737, 48, 257/693, 773; 324/765
See application file for complete search history.

(56) References Cited

U.S. PATENT DOCUMENTS 6,144,091 A  11/2000 Washida

| 6,265,783 B1* | 7/2001 | Juso et al. ................. 257/786 |
| 7,235,885 B2* | 6/2007 | Horii ......................... 257/777 |
| 7,400,134 B2* | 7/2008 | Morishita et al. ........ 324/158.1 |
| 2002/0050642 A1* | 5/2002 | Oota et al. ................. 257/738 |
| 2002/0149121 A1 | 10/2002 | Shikano et al. |
| 2005/0110155 A1 | 5/2005 | Horii |

FOREIGN PATENT DOCUMENTS

| CN | 1428852 A | 7/2003 |
| JP | 10-12809 A | 1/1998 |
| JP | 2001-257289 A | 9/2001 |
| JP | 2002-76251 A | 3/2002 |
| JP | 2002-314003 A | 10/2002 |
| JP | 2003-264256 A | 9/2003 |
| JP | 2004-22664 A | 1/2004 |
| JP | 2004-140080 A | 5/2004 |
| JP | 2004-342947 A | 12/2004 |
| JP | 2006-278374 A | 10/2006 |
| KR | 2004-0060781 A | 7/2004 |

\* cited by examiner

*Primary Examiner*—Jasmine J Clark
(74) *Attorney, Agent, or Firm*—Sughrue Mion, PLLC

(57) ABSTRACT

A semiconductor device includes a semiconductor chip and a wiring substrate. The wiring substrate is configured to be electrically connected to the semiconductor chip, and have a plurality of terminals arranged on an surface opposite to a surface on which the semiconductor chip is mounted. The plurality of terminals includes a plurality of first terminals configured to be arranged closely to each other, and a plurality of second terminals configured to be arranged so as to surround the plurality of first terminals. The plurality of second terminals is provided such that terminals of the semiconductor chip are connected to outer terminals through the plurality of second terminals. Each of the plurality of first terminals is not provided with a metal ball, while each of the plurality of second terminals is provided with a metal ball.

16 Claims, 14 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device, particularly to a terminal arrangement thereof.

2. Description of the Related Art

The advancement in a semiconductor technology has brought a progress in high integration and multifunction for LSI (Large Scale Integrated Circuit), further increasing the number of terminals to input/output signals. Complicated function incorporated in the LSI demands a high-level LSI test with the increasing number of terminals used for the test. Since the terminals used for the test are not used by a user, it is desirable to reduce the terminals as much as possible. Although efforts have been made to reduce the number of the terminals used exclusively for the test by sharing with other signal terminals or serializing a test signal, the number is still increasing.

The number of the terminals which can be mounted on a LSI package is physically limited. A technique to increase the number of the test terminals while securing the number of the terminals used by the user is disclosed in Japanese Laid-Open Patent Application JP-P2004-22664A. In a package of a semiconductor device, test terminals are arranged among external wiring terminals which are arranged in a lattice form in a BGA (ball grid array) or a CSP (chip size package). However, since the test terminals are located among the external wiring terminals used for common operations, it is not easy to contact the test terminals to terminals of a test tool.

Japanese Laid-Open Patent Application JP-P2004-342947A also discloses a technique for a semiconductor device including a plurality of connection terminals connected to a mounting substrate and a plurality of test terminals. In the semiconductor device, there are provided a first area wherein the connection terminals are arranged in a lattice form at a predetermined pitch, and a second area wherein the test terminals are arranged in a lattice form at a pitch narrower than the predetermined pitch. The second area is located at the center of a connecting side and surrounded in the outer edge by the first area which is arranged at the peripheral of the connecting side. The second area is also arranged at the peripheral of the connecting side, and the first area is arranged to surround the second area. These connection terminals and test terminals are formed by a solder ball. These connection terminals and test terminals are also formed in a land.

The arrangement of test terminals and common external terminals has been thus developed for improvement. However, when the test terminals are arranged among the external terminals, it is not easy to have a contact between the test terminal and the terminal of the test tool. Moreover, in an arrangement to centralize terminals exclusively used for a test, these terminals are connected to a mounting substrate even though they are not used by the user. Accordingly, the land is provided to connect these terminals exclusively used for the test on the surface of the mounting substrate. This causes the user to have less opening area on the surface of the mounting substrate for wiring as desired.

SUMMARY OF THE INVENTION

In order to achieve an aspect of the present invention, the present invention provides a semiconductor device including: a semiconductor chip; and a wiring substrate configured to be electrically connected to the semiconductor chip, and have a plurality of terminals arranged on an surface opposite to a surface on which the semiconductor chip is mounted, wherein the plurality of terminals includes: a plurality of first terminals configured to be arranged closely to each other, and a plurality of second terminals configured to be arranged so as to surround the plurality of first terminals, and provided such that terminals of the semiconductor chip are connected to outer terminals through the plurality of second terminals, wherein each of the plurality of first terminals is not provided with a metal ball, while each of the plurality of second terminals is provided with a metal ball.

In the present invention, the plurality of first terminals without including the metal balls are arranged closely to each other on the surface opposite to the surface on which the semiconductor chip is mounted, and the plurality of the second terminals including the metal balls are arranged so as to surround the first terminals. In this case, since the first terminals have no external connection when the semiconductor device is mounted to a mounting substrate (not shown), the user can obtain an opening area larger than before on the surface of the mounting substrate facing to the area to arrange the first terminals. Therefore, the user can execute wiring as desired in an area of the mounting substrate facing to the area to arrange the first terminals. In addition, since the second terminals do not exist on the backside of the position to mount the semiconductor chip, it is understood that the stress applied to the second terminals caused by the thermal expansion of the semiconductor chip can be substantially reduced.

According to the present invention, there is provided a semiconductor device to enable the increase of the test terminals while securing terminals used by the user. It is also possible to provide a semiconductor device in which stress caused by a thermal expansion is suppressed in terminals to connect the semiconductor device and the mounting substrate.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device according to the present invention will be described below with reference to the attached drawings.

First Embodiment

Figure 1A:
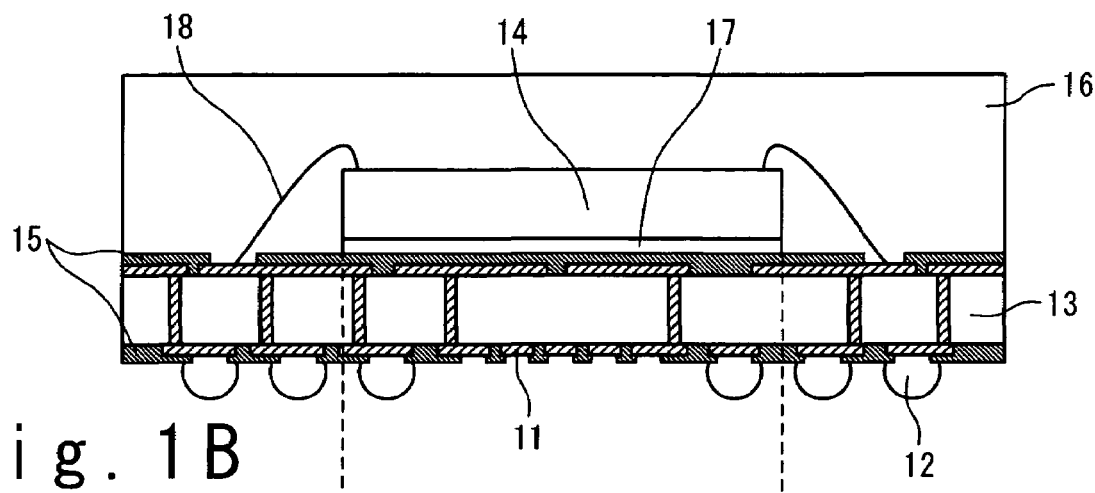
FIG. 1A is a diagram showing a cross-sectional view of a semiconductor device according to a first embodiment.
Figure 1B:
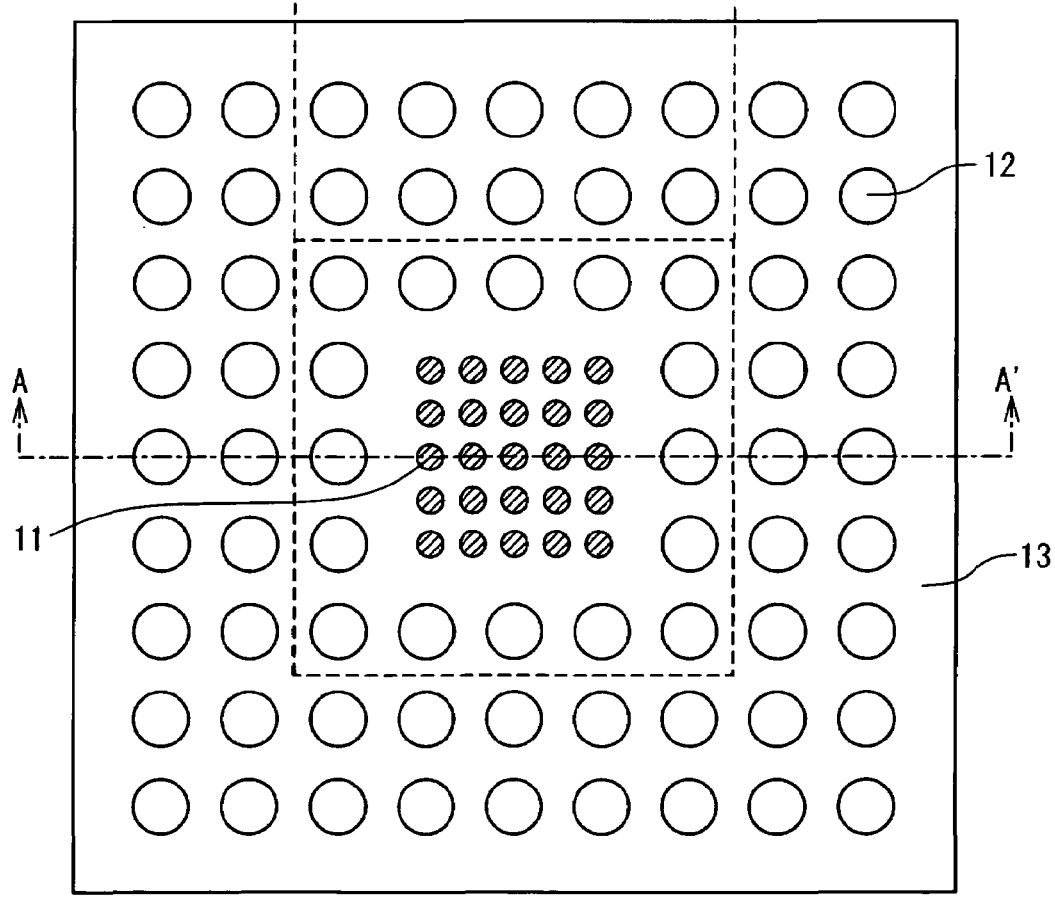
FIG. 1B is a diagram showing a bottom view of a semiconductor device according to the first embodiment.

FIG. 1B shows a bottom view of a semiconductor device according to a first embodiment. FIG. 1A shows a cross-sectional view at a cross-section A-A' in FIG. 1B of a semiconductor device according to the first embodiment. The semiconductor device includes a wiring substrate 13, a semiconductor chip 14, mold resin 16, a plurality of external terminals 11, and a plurality of external terminals 12. The wiring substrate 13 is provided with wiring by conductors such as copper, which is protected by a solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to a mounting substrate by the solder balls. A reference character (numeral) for each of the external terminals 11, 12 is shown only to each one representative terminal in FIGS. 1A and 1B, and circles with diagonal lines indicate the external terminals 11 and open circles indicate the external terminals 12 in FIG. 1B. It is not necessarily for the solder balls to be spherical. The solder balls may have various forms such as semispherical, and the height may be lower than the semispherical form. There are solder balls in which a core is made of resin or other metals such as copper (Cu).

The semiconductor chip 14 is attached to the opposite side of the area to arrange the external terminals 11 and 12 on the wiring substrate 13 by means of a die-bonding material 17. The semiconductor chip 14 is electrically connected to the wiring of the wiring substrate 13 by using bonding wires 18. The mold resin 16 covers and fixes the semiconductor chip 14 and the bonding wires 18 on the wiring substrate 13 for protection.

As shown in FIG. 1B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. In this case, all the external terminals 11 and a part of the external terminals 12 are arranged in one side of the wiring substrate 13, while the semiconductor chip 14 is mounted in another (opposite) side of the wiring substrate 13. Since the external terminals 11 have no external connection when the semiconductor device is mounted to a mounting substrate (not shown), the user can execute wiring as desired in an area of the mounting substrate facing to the area to arrange the external terminals 11.

The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

When all the terminals includes the solder balls, it is restricted by the size of the solder balls or the land to narrow the pitch between the terminals. Therefore, flexibility of the arrangement is increased by changing the size of the lands based on the change of the pitch between the terminals. When the lands mounting the solder balls (attached to the solder balls) are equivalent in terms of the size, the heights of the terminals are consistent, thereby this generate no step in the height of the terminals. On the other hand, when the solder balls of the same size are mounted on the lands of different sizes, the heights of the terminals are different, thereby this causes steps in the height of the terminals.

There is usually one kind of a size of the solder balls which are mounted to one package, and the solder balls are collectively mounted to all the lands of the package. When the one-sized solder balls are mounted to the different-sized lands, the terminals have different heights in the size. It is possible to determine the size of the solder balls to meet the size of the lands and the height of the terminals so that the height of the terminals can be equivalent by mounting the solder balls. However, since the size of the solder balls is limited to certain step sizes, an optimum-sized solder ball can be obtained only by preparing a custom-made solder ball having a special size. It is technically possible, but costly. Moreover, in order to mount the different-sized solder balls, a process is required to mount the each different-sized solder ball, which causes the increase of the manufacturing cost. Further, in conducting several mountings of the solder balls, the solder balls which have been already mounted need to be avoided to contact. Therefore, it is more likely to have phenomena of positioning gaps, fall of the solder balls due to a vibration, and the like, which will result in more demerits. Consequently, when the pitch between the terminals is changed in one semiconductor device, the external terminals 11 without the solder balls and the external terminals 12 with the solder balls are arranged to overcome these demerits and to increase the flexibility of the arrangement as described in the above embodiment.

Second Embodiment

Figure 2A:
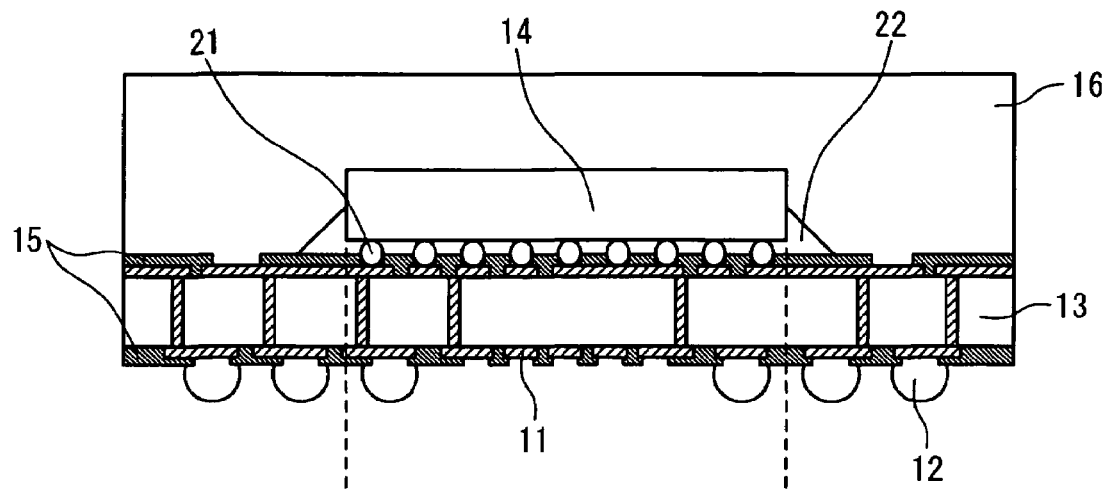
FIG. 2A is a diagram showing a cross-sectional view of a semiconductor device according to a second embodiment.
Figure 2B:
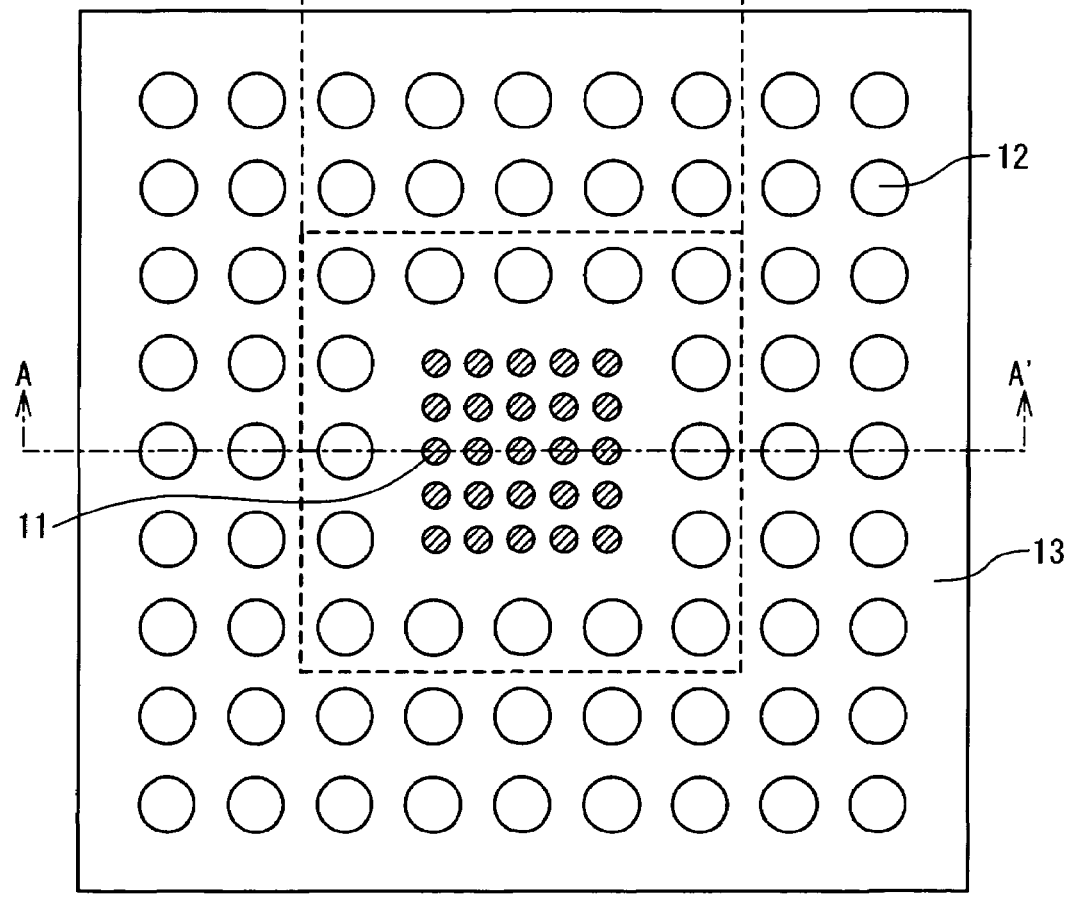
FIG. 2B is a diagram showing a bottom view of a semiconductor device according to the second embodiment.

FIG. 2B shows a bottom view of a semiconductor device according to a second embodiment. FIG. 2A shows a cross-sectional view at a cross-section A-A' in FIG. 2B of a semiconductor device according to the second embodiment. The semiconductor device includes the wiring substrate 13, the semiconductor chip 14, the mold resin 16, the plurality of external terminals 11, and the plurality of external terminals 12. The wiring substrate 13 is provided with wiring by conductors such as copper, which is protected by a solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to the mounting substrate by the solder balls.

The semiconductor chip 14 is mounted to the opposite side of the area to arrange the external terminals 11 and 12. The semiconductor chip 14 is electrically connected to the wiring of the wiring substrate 13 by bumps 21 such as solders, and attached to the wiring substrate 13 by underfill resin 22. The mold resin 16 covers and fixes the semiconductor chip 14 and the underfill resin 22 on the wiring substrate 13 for protection.

The arrangement of the external terminals 11 and 12 in the second embodiment is the same as that of the first embodiment. As shown in FIG. 2B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. In this case, all the external terminals 11 and a part of the external terminals 12 are arranged in one side of the wiring substrate 13, while the semiconductor chip 14 is mounted in another (opposite) side of the wiring substrate 13. Since the external terminals 11 have no external connection when the semiconductor device is mounted to the mounting substrate, the user can execute wiring as desired in an area of the mounting substrate facing to the area to arrange the external terminals 11.

The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Third Embodiment

Figure 3A:
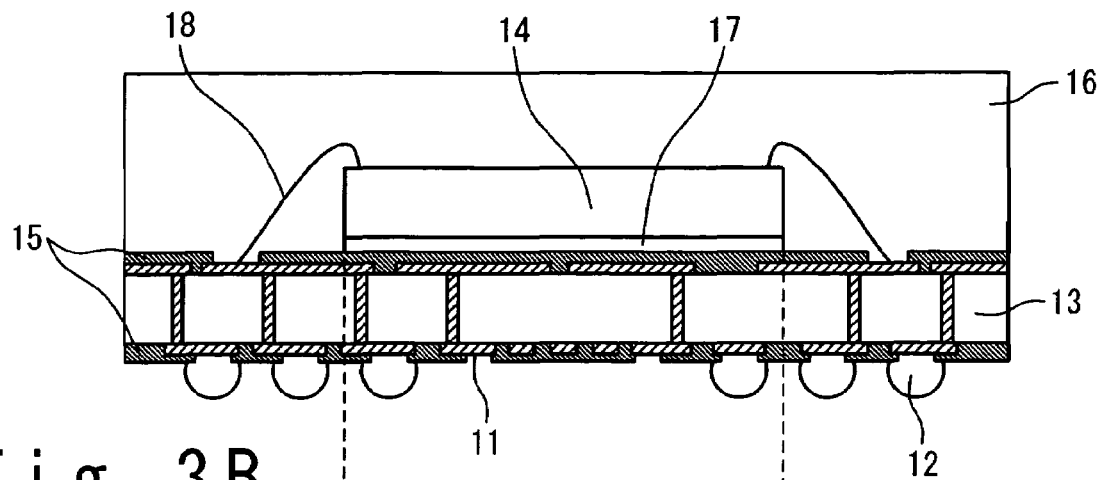
FIG. 3A is a diagram showing a cross-sectional view of a semiconductor device according to a third embodiment.
Figure 3B:
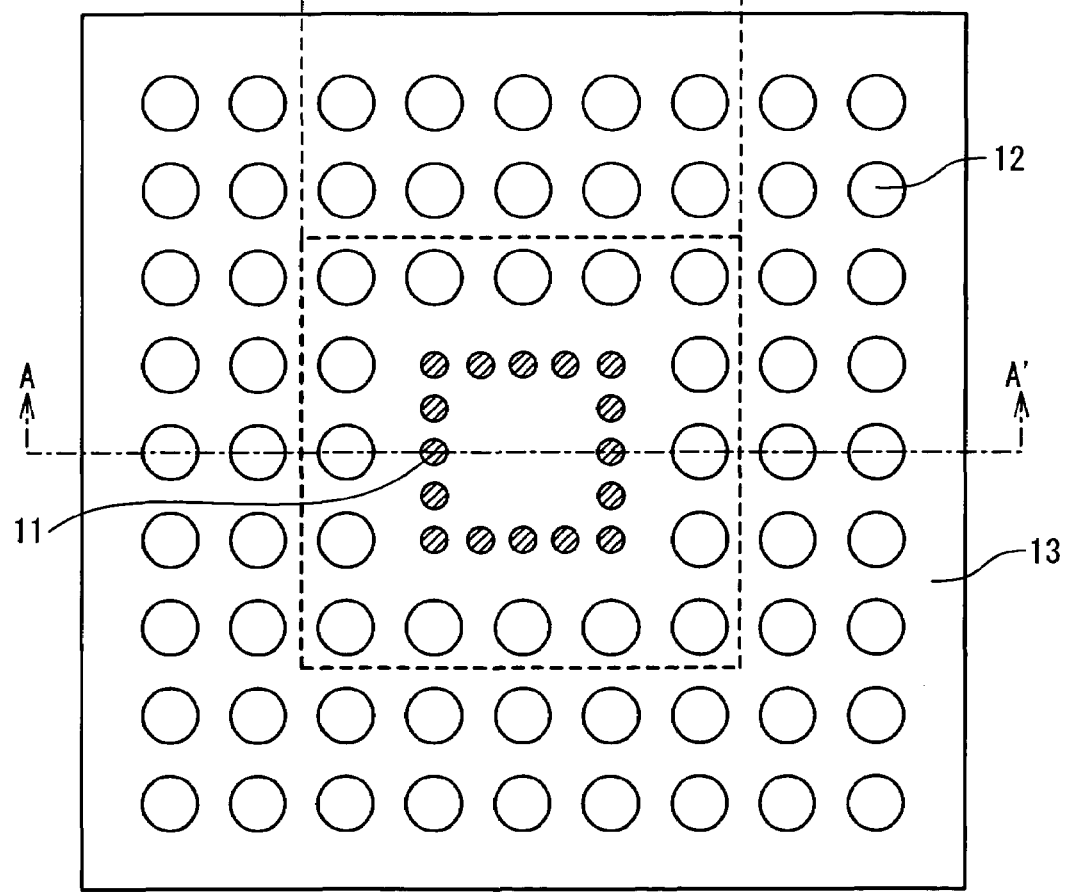
FIG. 3B is a diagram showing a bottom view of a semiconductor device according to the third embodiment.

FIG. 3B shows a bottom view of a semiconductor device according to a third embodiment. FIG. 3A shows a cross-sectional view at a cross-section A-A' in FIG. 3B of a semiconductor device according to the second embodiment. The semiconductor device includes the wiring substrate 13, the semiconductor chip 14, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to the mounting substrate by the solder balls.

The semiconductor chip 14 is attached to the opposite side of the area to arrange the external terminals 11 and 12 on the wiring substrate 13 by means of a die-bonding material 17. The semiconductor chip 14 is electrically connected to the wiring of the wiring substrate 13 by using bonding wires 18. The mold resin 16 covers and fixes the semiconductor chip 14 and the bonding wires 18 on the wiring substrate 13 for protection.

As shown in FIG. 3B, the plurality of the external terminals 11 without including the solder balls are arranged in one line in the inside of the external terminals 12 including the solder balls which are arranged on a bottom of the wiring substrate 13 in a lattice form. Although one-line arrangement is shown here, the external terminals 11 may be arranged in equal to or more than two lines. More precisely, the external terminals 11 of the third embodiment are terminals with an opening area in the center of the plurality of the external terminals 11 according to the first embodiment. Therefore, when the semiconductor device is mounted to the mounting substrate, an area of the mounting substrate facing the area surrounded by the external terminals 11 and the area to arrange the external terminals 11 is open area so that the user can execute wiring as desired on this area in the same manner with the first embodiment.

Fourth Embodiment

When a semiconductor device is mounted to the mounting substrate, connection terminals and test terminals are connected to the mounting substrate. A thermal expansion occurs in the semiconductor device mounting the semiconductor chip, because of a reflow heating in mounting the semiconductor device to the mounting substrate, a change of an environmental temperature after the mounting, or an increase of a temperature by heat generated by the operation of a semiconductor chip. This thermal expansion causes a thermal expansion of the mounting substrate mounting the semiconductor device. The mounting substrate has a thermal expansion coefficient of 12 to 16 ppm/° C. (degree centigrade) which is different by one order of magnitude from that of the semiconductor chip which is about 3 ppm/° C. (degree centigrade). An area not-mounting the semiconductor chip in the semiconductor device has practically the same a thermal expansion coefficient as that of the mounting substrate. However, an area mounting the semiconductor chip is influenced by thermal behavior of semiconductor chip (silicon), and shows behavior having a thermal expansion coefficient mixed with the thermal expansion coefficient of silicon. Specifically, the semiconductor device thermally expands in the same level with the mounting substrate to which the semiconductor device is mounted, wherein only a part attached to the semiconductor chip in the semiconductor device is limited to thermally expand in the same level with the semiconductor chip. Therefore, terminals arranged to that part are caused to have a large stress. In particular, among solder balls placed directly under the semiconductor chip, the solder balls in the outer-most edge will receive the highest effect of the difference against the thermal expansion of the mounting substrate. A fourth embodiment to reduce the effect of this thermal expansion will be explained.

Figure 4A:
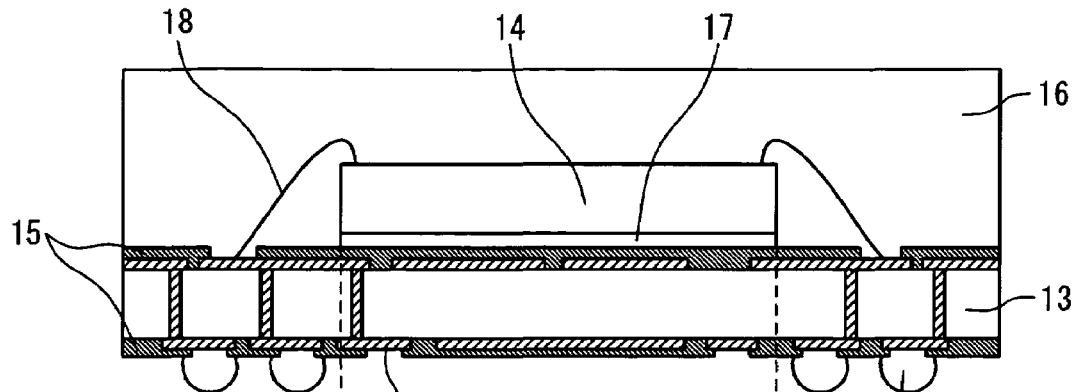
FIG. 4A is a diagram showing a cross-sectional view of a semiconductor device according to a fourth embodiment.
Figure 4B:
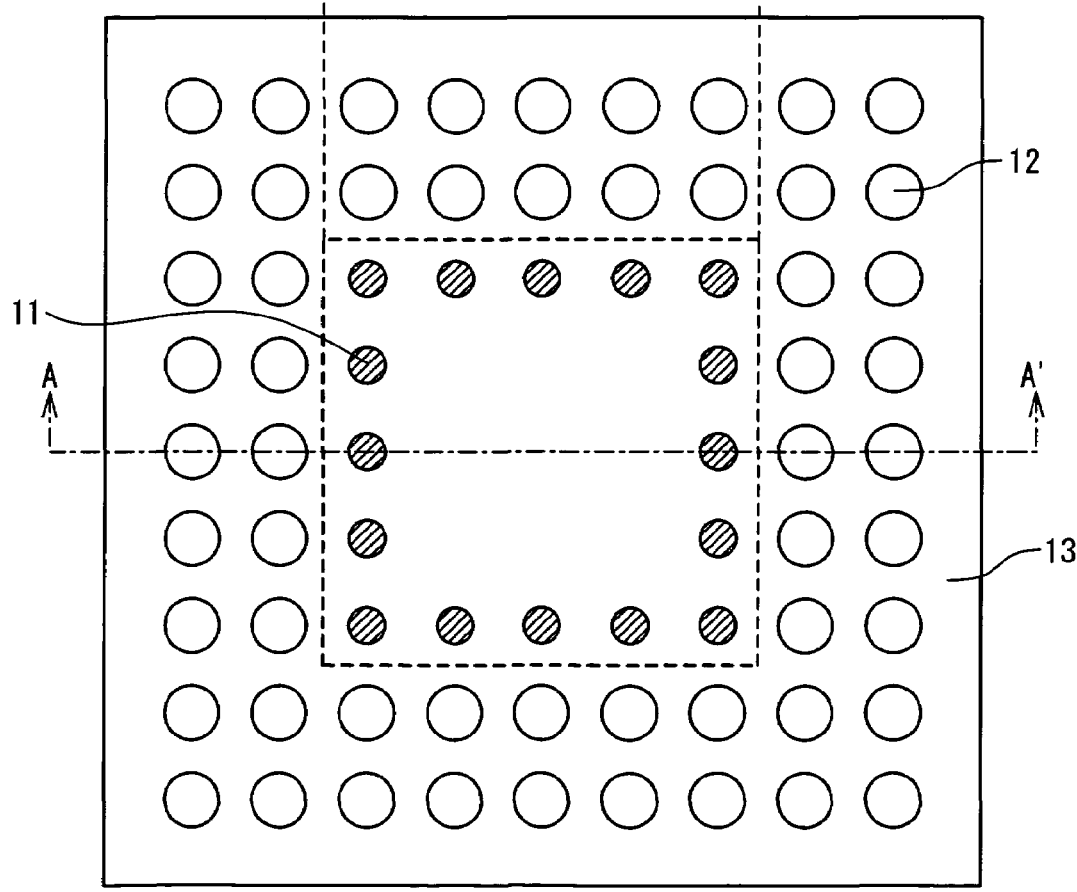
FIG. 4B is a diagram showing a bottom view of a semiconductor device according to the fourth embodiment.

FIG. 4B shows a bottom view of a semiconductor device according to the fourth embodiment. FIG. 4A shows a cross-sectional view at a cross-section A-A' in FIG. 4B of a semiconductor device according to the fourth embodiment. The semiconductor device includes the wiring substrate 13, the semiconductor chip 14, the mold resin 16, the plurality of external terminals 11, and the plurality of external terminals 12. The wiring substrate 13 is provided with wiring by the conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to the mounting substrate by the solder balls.

The semiconductor chip 14 is attached to the opposite side of the area to arrange the external terminals 11 and 12 on the wiring substrate 13 by means of the die-bonding material 17. The semiconductor chip 14 is electrically connected to the wiring of the wiring substrate 13 by using the bonding wires 18. The mold resin 16 covers and fixes the semiconductor chip 14 and the bonding wires 18 on the wiring substrate 13 for protection.

As shown in FIG. 4B, the plurality of the external terminals 11 without including the solder balls are arranged in one line in the inside of the external terminals 12 including the solder balls which are arranged on a bottom of the wiring substrate 13 in a lattice form. Although one-line arrangement is shown here, the external terminals 11 may be arranged in equal to or more than two lines. In this case, the external terminals 11 are arranged on the backside of the position to mount the semiconductor chip 14, wherein the external terminals 12 are arranged in the outside of the external terminals 11. When the semiconductor device is mounted to the mounting substrate, the area to mount the external terminals 11 and the area surrounded by the external terminals 11 are not connected to the mounting substrate. Accordingly, it is possible for the user to execute wiring as desired in an area on the mounting substrate facing to the above-mentioned area. Moreover, since the external terminals 12 do not exist on the backside of the position to mount the semiconductor chip 14, it is understood that the stress applied to the external terminals 12 caused by the thermal expansion can be substantially reduced.

At this time, the external terminals 11 are arranged at a pitch equivalent to that of the external terminals 12, and the size of the opening area of the external terminals 11 is also equivalent to that of the external terminals 12. Accordingly, the external terminals 11 and the external terminals 12 can be arranged on the same lattice.

Fifth Embodiment

Figure 5A:
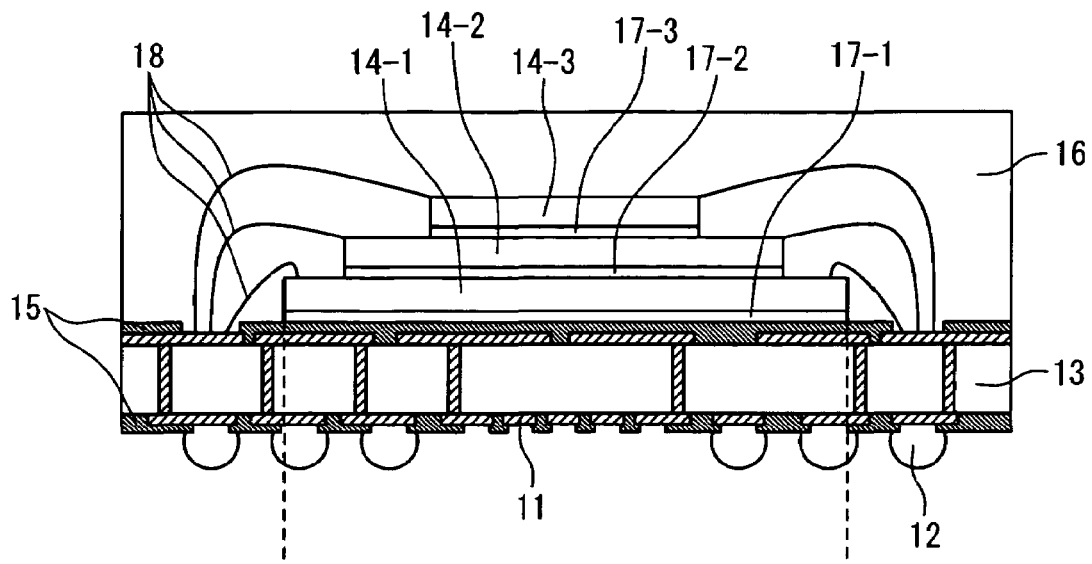
FIG. 5A is a diagram showing a cross-sectional view of a semiconductor device according to a fifth embodiment.
Figure 5B:
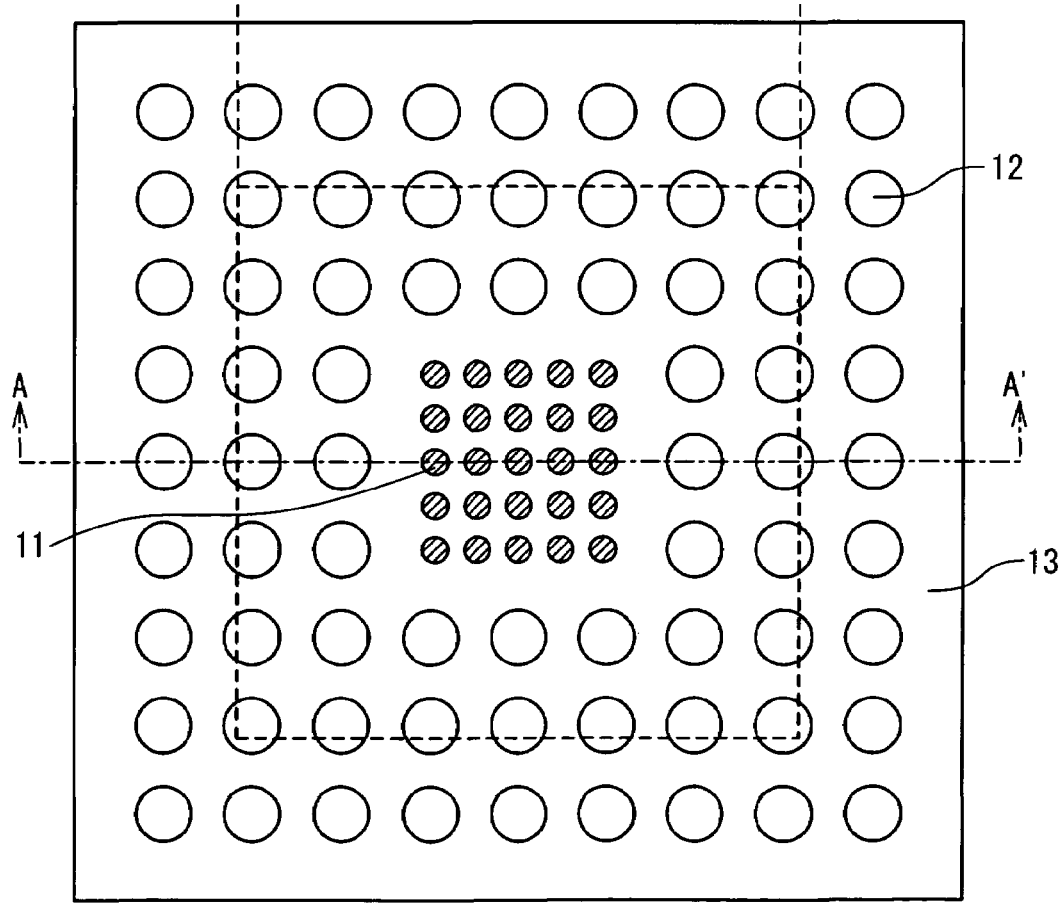
FIG. 5B is a diagram showing a bottom view of a semiconductor device according to the fifth embodiment.

FIG. 5B shows a bottom view of a semiconductor device according to the fifth embodiment. FIG. 5A shows a cross-sectional view at a cross-section A-A' in FIG. 5B of a semiconductor device according to the fifth embodiment. The semiconductor device includes the wiring substrate 13, semiconductor chips 14-1, 14-2, 14-3, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to the mounting substrate by the solder balls.

The semiconductor chip 14-1 is attached to the opposite side of the area to arrange the external terminals 11 and 12 on the wiring substrate 13 by means of a die-bonding material 17-1. The semiconductor chip 14-1 is electrically connected to the wiring of the wiring substrate 13 by using bonding wires 18. The semiconductor chip 14-2 is attached onto the semiconductor chip 14-1 by a die-bonding material 17-2. The semiconductor chip 14-2 is electrically connected to the wiring of the wiring substrate 13 by using the bonding wires 18. The semiconductor chip 14-3 is attached to the semiconductor chip 14-2 by a die-bonding material 17-3. The semiconductor chip 14-3 is electrically connected to the wiring of the wiring substrate 13 by using the bonding wires 18. Specifically, the semiconductor chips 14-1, 14-2 and 14-3 are stacked on the wiring substrate 13. The mold resin 16 covers and fixes the semiconductor chips 14-1, 14-2 and 14-3 stacked on the wiring substrate 13 along with the bonding wires 18 for protection.

As shown in FIG. 5B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. In this case, all the external terminals 11 and a part of the external terminals 12 are arranged in one side (backside) area of the wiring substrate 13, while the semiconductor chip 14-1, i.e. the lowest layer, is directly attached to another side of the wiring substrate 13. Since the external terminals 11 have no external connection when the semiconductor device is mounted to the mounting substrate, the user can execute wiring as desired in an area of the mounting substrate facing to the area to arrange the external terminals 11.

The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Sixth Embodiment

Figure 6A:
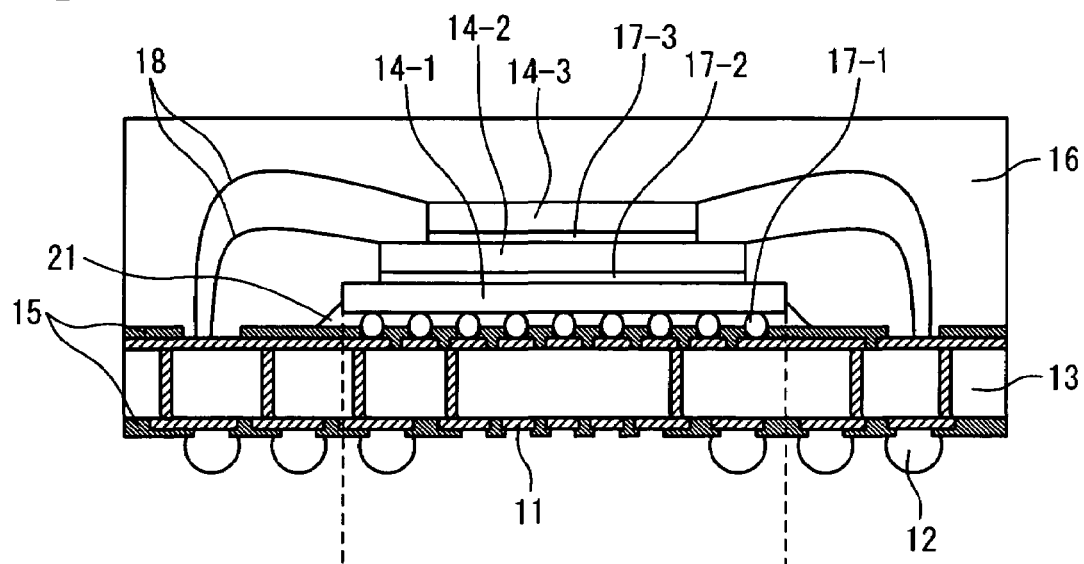
FIG. 6A is a diagram showing a cross-sectional view of a semiconductor device according to a sixth embodiment.
Figure 6B:
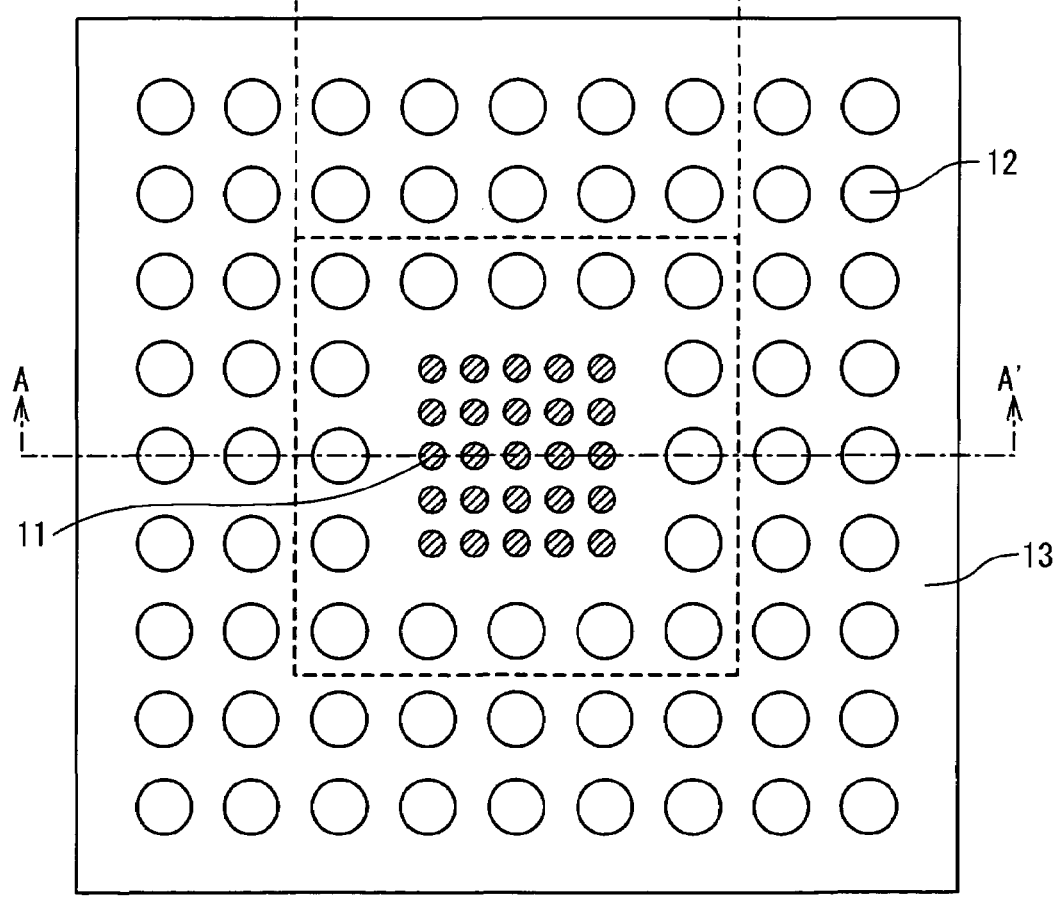
FIG. 6B is a diagram showing a bottom view of a semiconductor device according to the sixth embodiment.

FIG. 6B shows a bottom view of a semiconductor device according to a sixth embodiment. FIG. 6A shows a cross-sectional view at a cross-section A-A' in FIG. 6B of a semiconductor device according to the sixth embodiment. The semiconductor device includes the wiring substrate 13, the semiconductor chips 14-1, 14-2, 14-3, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15. The external terminals 12 are connected to the mounting substrate by the solder balls.

The semiconductor chip 14-1 is attached to the opposite side of the area to arrange the external terminals 11 and 12 on the wiring substrate 13 by means of underfill resin 22. The semiconductor chip 14-1 is electrically connected to the wiring of the wiring substrate 13 by a bump 21. The semiconductor chip 14-2 is attached onto the semiconductor chip 14-1 by the die-bonding material 17-2. The semiconductor chip 14-2 is electrically connected to the wiring of the wiring substrate 13 by using bonding wires 18. The semiconductor chip 14-3 is attached onto the semiconductor chip 14-2 by the die-bonding material 17-3. The semiconductor chip 14-3 is electrically connected to the wiring of the wiring substrate 13 by the bonding wires 18. Specifically, the semiconductor chips 14-1, 14-2 and 14-3 are stacked on the wiring substrate 13. The mold resin 16 covers and fixes the semiconductor chips 14-1, 14-2 and 14-3 stacked on the wiring substrate 13 along with the bonding wires 18 for protection.

As shown in FIG. 6B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. In this case, all the external terminals 11 and a part of the external terminals 12 are arranged in on one side (back side) of the wiring substrate 13, while the semiconductor chip 14-1, i.e. the lowest layer, is directly attached to another side of the wiring substrate 13. Since the external terminals 11 have no external connection when the semiconductor device is mounted to the mounting substrate, the user can execute wiring as desired in an area of the mounting substrate facing to the area to arrange the external terminals 11.

The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Seventh Embodiment

Figure 7A:
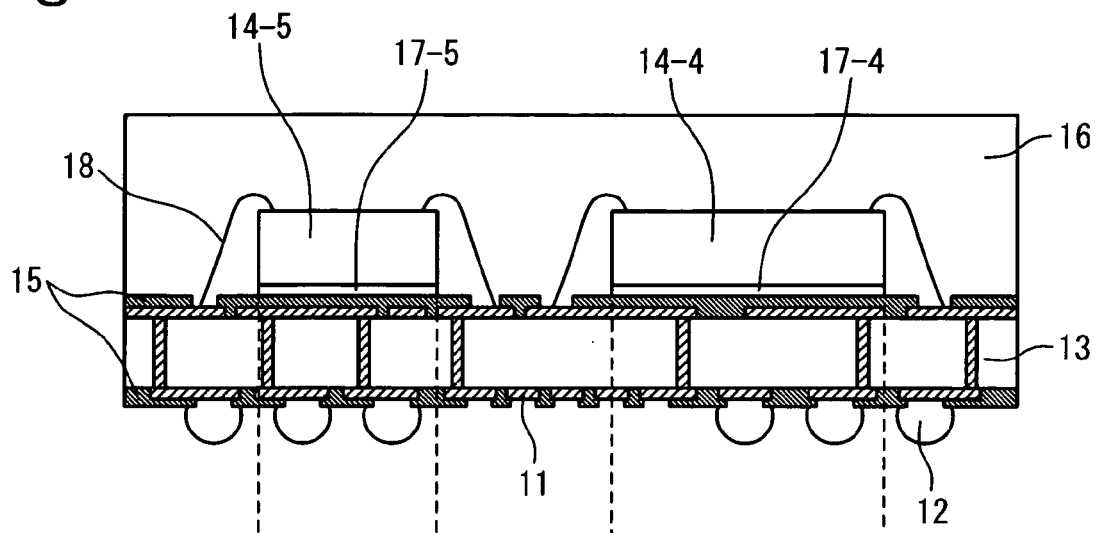
FIG. 7A is a diagram showing a cross-sectional view of a semiconductor device according to a seventh embodiment.
Figure 7B:
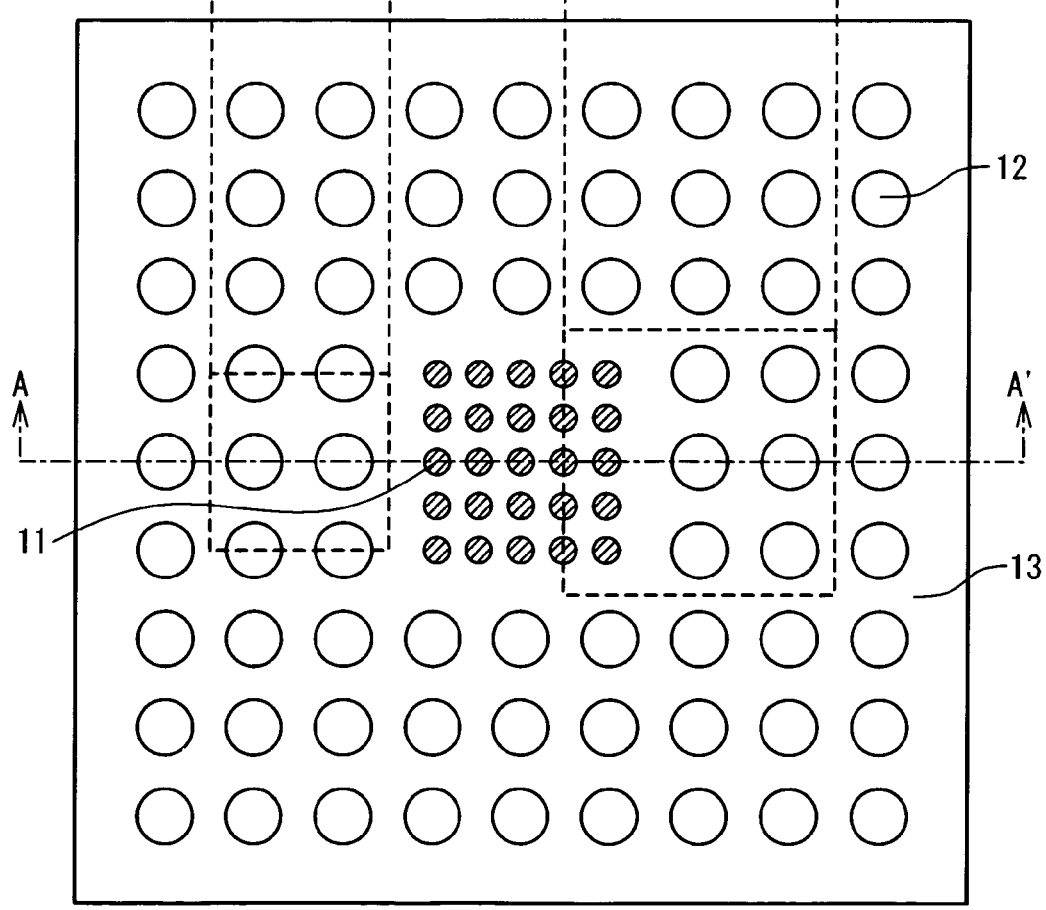
FIG. 7B is a diagram showing a bottom view of a semiconductor device according to the seventh embodiment.

FIG. 7B shows a bottom view of a semiconductor device according to a seventh embodiment. FIG. 7A shows a cross-sectional view at a cross-section A-A' in FIG. 7B of a semiconductor device according to the seventh embodiment. The semiconductor device includes the wiring substrate 13, semiconductor chips 14-4, 14-5, the mold resin 16, the plurality of external terminals 11, and the plurality of external terminals 12. The wiring substrate 13 is provided with wiring by conductors such as copper, which is protected by a solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15, and connected to the mounting substrate by the solder balls.

The semiconductor chip 14-4 is attached to the opposite side of the area to arrange the external terminals 11 and 12 on the wiring substrate 13 by means of a die-bonding material 17-4. The semiconductor chip 14-4 is electrically connected to the wiring of the wiring substrate 13 by using the bonding wires 18. The semiconductor chip 14-5 is arranged next to the semiconductor chip 14-4, and attached on the wiring substrate 13 by means of a die-bonding material 17-5. The semiconductor chip 14-5 is electrically connected to the wiring of the wiring substrate 13 by the bonding wires 18. The mold resin 16 covers and fixes the semiconductor chips 14-4 and 14-5 along with the bonding wires 18 on the wiring substrate 13 for protection.

As shown in FIG. 7B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. Since the external terminals 11 have no external connection when the semiconductor device is mounted to the mounting substrate, the user can execute wiring as desired in an area of the mounting substrate facing to the area to arrange the external terminals 11.

The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally. It is particularly effective to have this layout for externally outputting, from the semiconductor device, signals between the semiconductor chips 14-4 and 14-5 required to have a contact only for a test, since the signals are likely to be collected at the center of the semiconductor device.

Eighth Embodiment

Figure 8A:
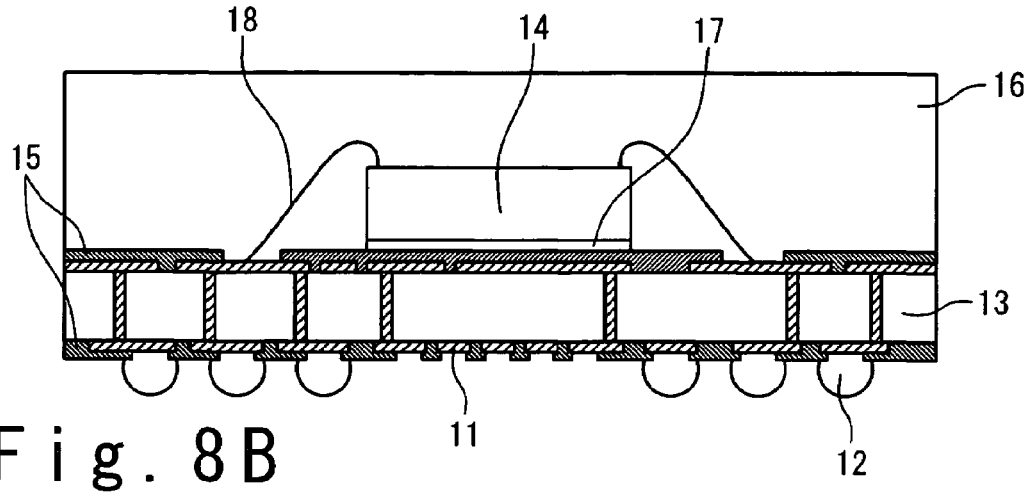
FIG. 8A is a diagram showing a cross-sectional view of a semiconductor device according to an eighth embodiment.
Figure 8B:
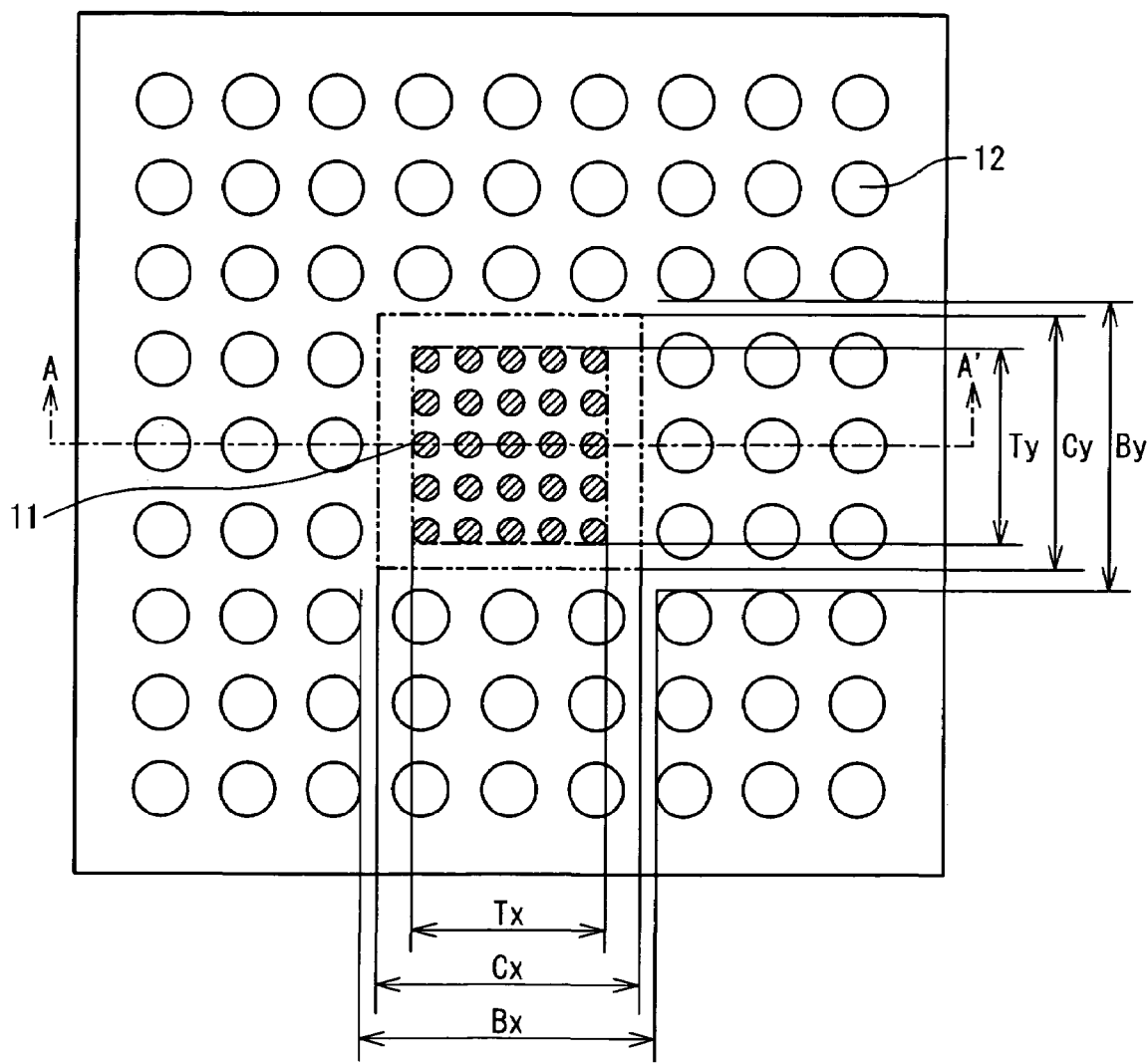
FIG. 8B is a diagram showing a bottom view of a semiconductor device according to the eighth embodiment.

FIG. 8B shows a bottom view of a semiconductor device according to an eighth embodiment. FIG. 8A shows a cross-sectional view at a cross-section A-A' in FIG. 8B of a semiconductor device according to the eighth embodiment. The semiconductor device includes the wiring substrate 13, the semiconductor chip 14, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15, and connected to a mounting substrate by the solder balls.

The semiconductor chip 14 is attached to the opposite side of the area to arrange the external terminals 11 and 12 on the wiring substrate 13 by means of the die-bonding material 17. The semiconductor chip 14 is electrically connected to the wiring of the wiring substrate 13 by using the bonding wires 18. The mold resin 16 covers and fixes the semiconductor chip 14 along with the bonding wires 18 on the wiring substrate 13 for protection.

As shown in FIG. 8B, the plurality of the external terminals 11 without including the solder balls are arranged in the center area of the bottom of the wiring substrate 13 in a lattice form. The plurality of the external terminals 12 is arranged so as to surround the outer edge of the external terminals 11. In this case, the external terminals 11 are arranged in the backside area of the wiring substrate 13 which is opposite to the area to mount the semiconductor chip 14, wherein the external terminals 12 are not arranged. Specifically, it will be expressed as follows. The semiconductor chip 14 is mounted to the backside of Cx×Cy area, the external terminals 11 are arranged in Tx×Ty area, and the external terminals 12 are arranged in the outside of Bx×By area. The Tx×Ty area to arrange the external terminals 11 is located inside the area to arrange the external terminals 12 (Bx≧Tx, By≧Ty). There is no external terminal 12 exist in the Cx×Cy area in which the semiconductor chip 14 is mounted on the backside (Bx≧Cx, By≧Cy).

When the semiconductor device is mounted to the mounting substrate, the external terminals 11 arranged directly under the semiconductor chip 14 are not connected to the mounting substrate. Since the external terminals 12 connect the wiring substrate 13 to the mounting substrate with practically the same thermal expansion coefficient, the external terminals 12 have substantially small stress caused by the thermal expansion.

Since the area of the mounting substrate facing to the area to arrange the external terminals 11 is not connected to the semiconductor device, the user can position the wiring as desired in this area. The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Figure 9A:
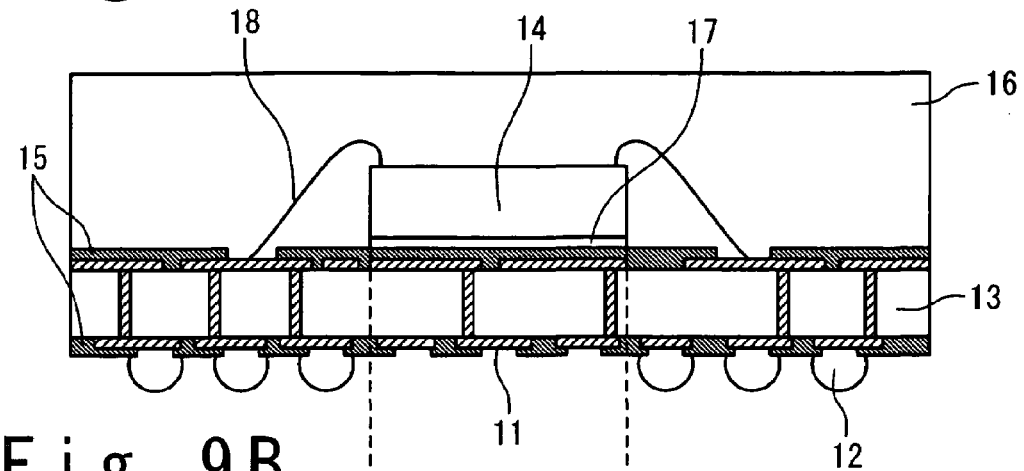
FIG. 9A is a diagram showing a modified example of a cross-sectional view of the semiconductor device according to the eighth embodiment.
Figure 9B:
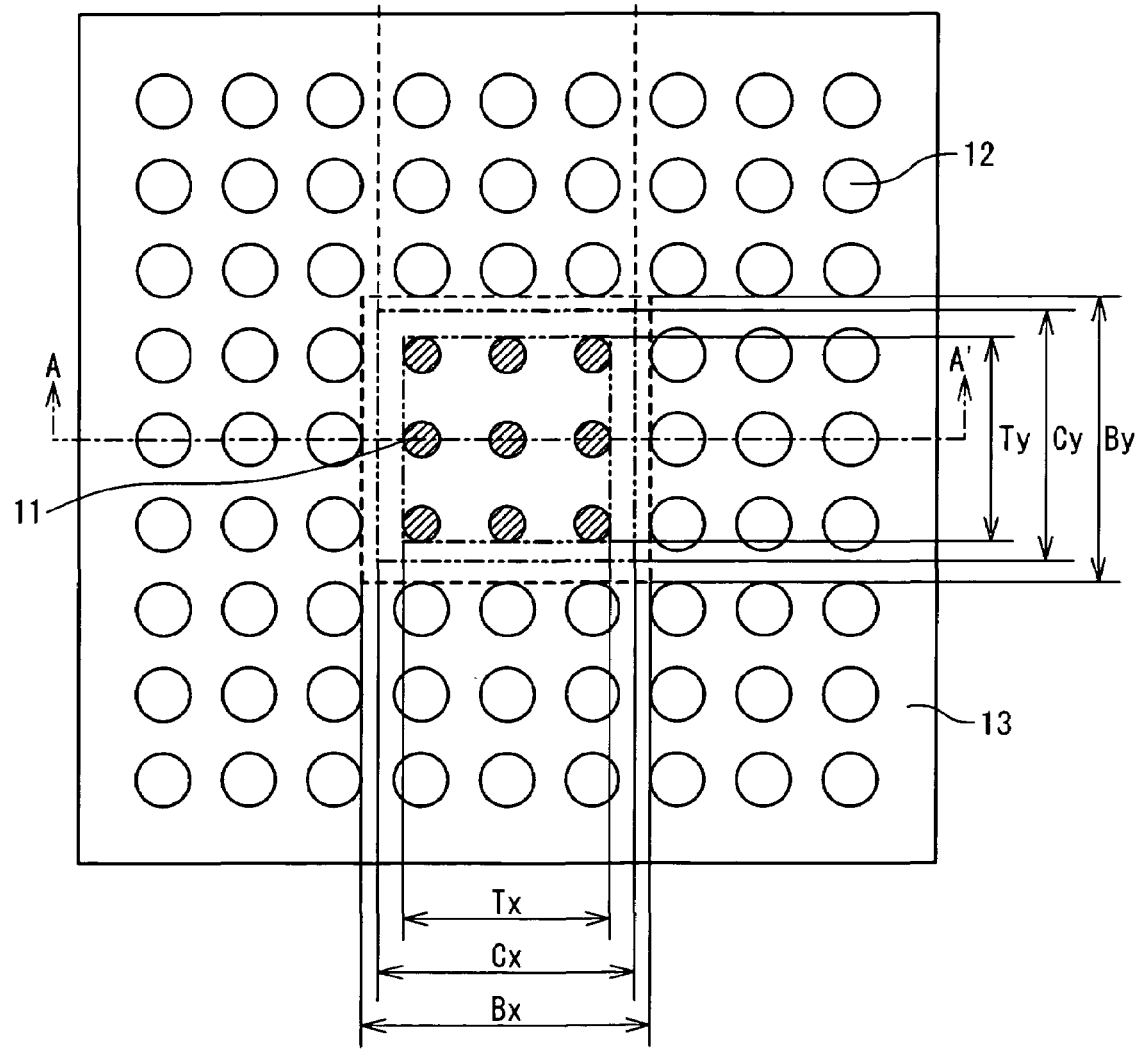
FIG. 9B is a diagram showing a modified example of a cross-sectional view of the semiconductor device according to the eighth embodiment.

FIG. 9B shows a bottom view of a modified example of a semiconductor device according to the eighth embodiment. FIG. 9A shows a cross-sectional view at a cross-section A-A' in FIG. 9B of the modified example of a semiconductor device according to the eighth embodiment. As shown in FIGS. 9A and 9B, the external terminals 11 may be arranged at the same pitch with the external terminals 12, and the opening area of the external terminals 11 may also be the same with the external terminals 12. In this case, it is possible to arrange the external terminals 11 and the external terminals 12 on the same lattice.

Ninth Embodiment

Figure 10A:
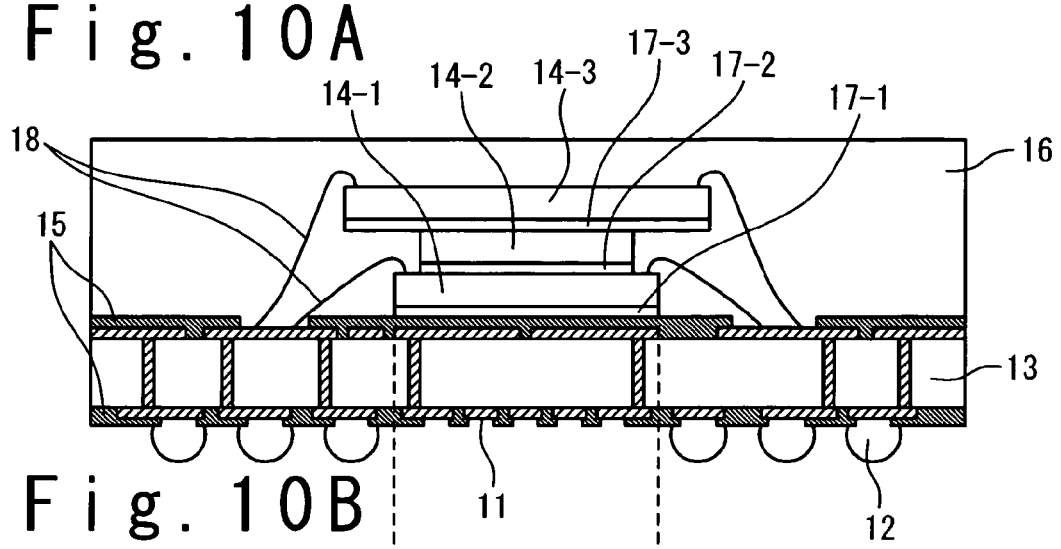
FIG. 10A is a diagram showing a cross-sectional view of a semiconductor device according to a ninth embodiment.
Figure 10B:
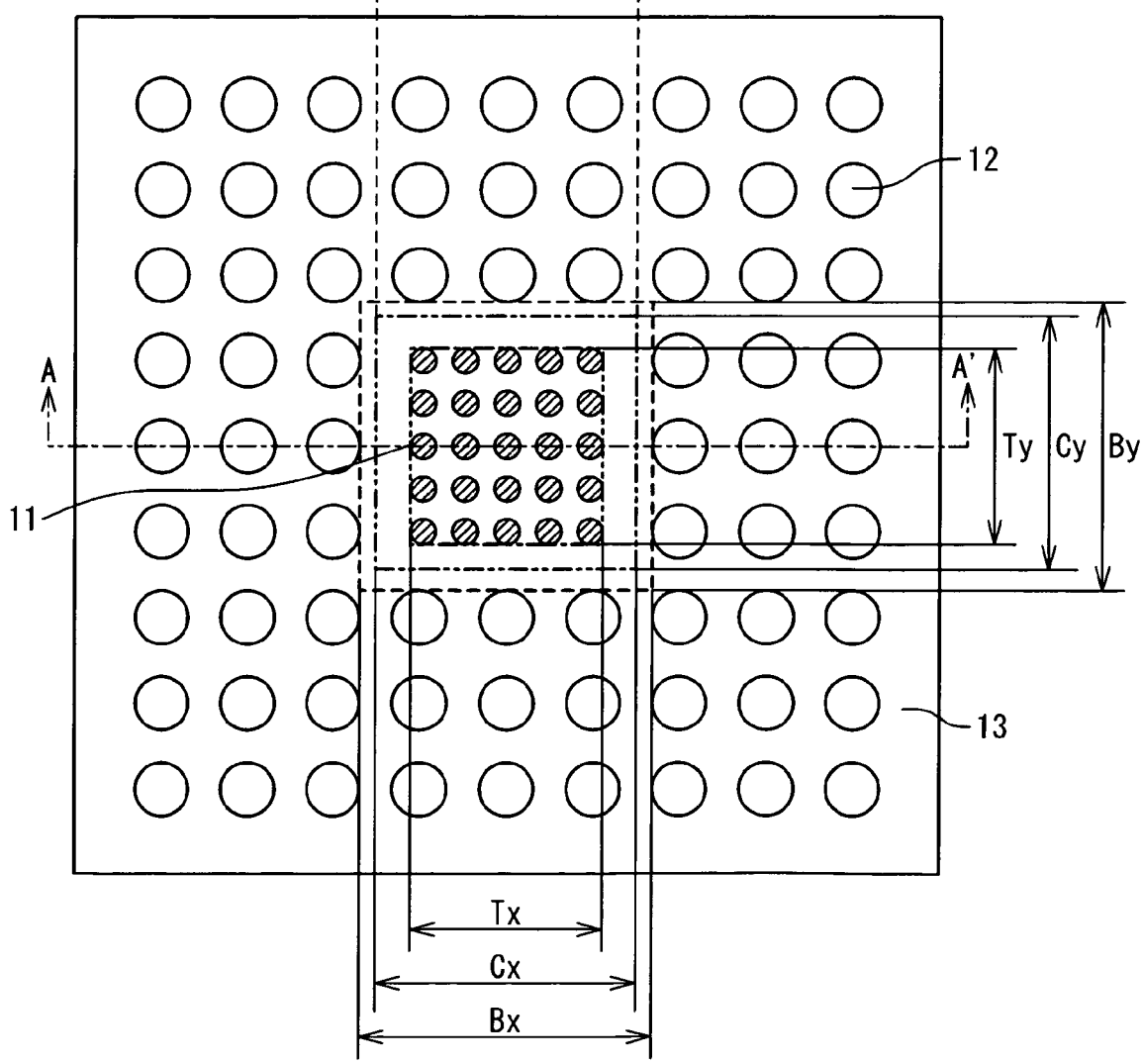
FIG. 10B is a diagram showing a bottom view of a semiconductor device according to the ninth embodiment.

FIG. 10B shows a bottom view of a semiconductor device according to a ninth embodiment. FIG. 10A shows a cross-sectional view at a cross-section A-A' in FIG. 10B of a semiconductor device according to the ninth embodiment. The semiconductor device includes the wiring substrate 13, the semiconductor chips 14-1, 14-2, 14-3, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15, and connected to the mounting substrate by the solder balls.

The semiconductor chip 14-1 is attached to the opposite side of the area to arrange the external terminals 11 and 12 on the wiring substrate 13 by means of the die-bonding material 17-1. The semiconductor chip 14-1 is electrically connected to the wiring of the wiring substrate 13 by using the bonding wires 18. The semiconductor chip 14-2 is attached onto the semiconductor chip 14-1 by the die-bonding material 17-2. The semiconductor chip 14-2 is electrically connected to the wiring of the wiring substrate 13 by the bonding wires 18. The semiconductor chip 14-3 is attached onto the semiconductor chip 14-2 by the die-bonding material 17-3. The semiconductor chip 14-3 is electrically connected to the wiring of the wiring substrate 13 by the bonding wires 18. Specifically, the semiconductor chips 14-1, 14-2 and 14-3 are stacked on thawing substrate 13. The mold resin 16 covers and fixes the semiconductor chips 14-1, 14-2 and 14-3 stacked on the wiring substrate 13 along with the bonding wires 18 for protection.

As shown in FIG. 10B, the plurality of the external terminals 11 without including the solder balls are arranged in the center area of a bottom of the wiring substrate 13 in a lattice form. The plurality of the external terminals 12 including the solder balls are arranged so as to surround the outer edge of the external terminals 11. In this case, the external terminals 11 are arranged in the backside area of the wiring substrate 13 which is opposite to the area to mount the semiconductor chip 14-1, wherein the external terminals 12 are not arranged. Specifically, it will be expressed as follows. The semiconductor chip 14-1 positioned at the lowest is mounted to the backside of Cx×Cy area, the external terminals 11 are arranged in Tx×Ty area, and the external terminals 12 are arranged in the outside of Bx×By area. The Tx×Ty area to arrange the external terminals 11 is located inside the area to arrange the external terminals 12 (Bx≧Tx, By≧Ty). There is no external terminal 12 exist in the Cx×Cy area in which the semiconductor chip 14-1 is mounted on the backside (Bx≧Cx, By≧Cy).

When the semiconductor device is mounted to the mounting substrate, the external terminals 11 which are arranged directly under the semiconductor chip 14 are not connected to the mounting substrate. Since the external terminals 12 connect the wiring substrate 13 to the mounting substrate with practically the same thermal expansion coefficient, the external terminals 12 have substantially small stress caused by the thermal expansion.

Since the area of the mounting substrate facing to the area to arrange the external terminals 11 is not connected to the semiconductor device, the user can execute wiring as desired in this area. The external terminals 11 are arranged at the pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Figure 11A:
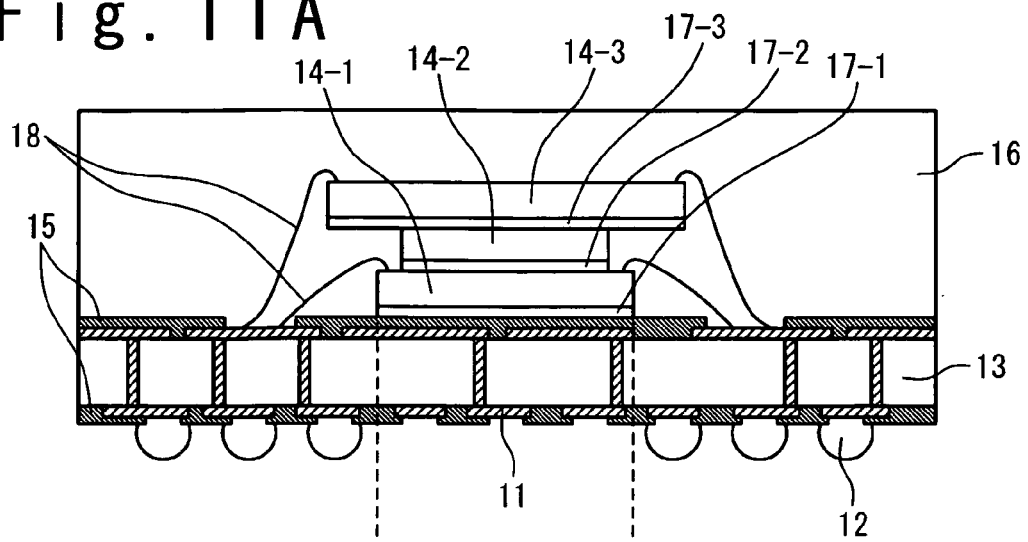
FIG. 11A is a diagram showing a modified example of a cross-sectional view of the semiconductor device according to the ninth embodiment.
Figure 11B:
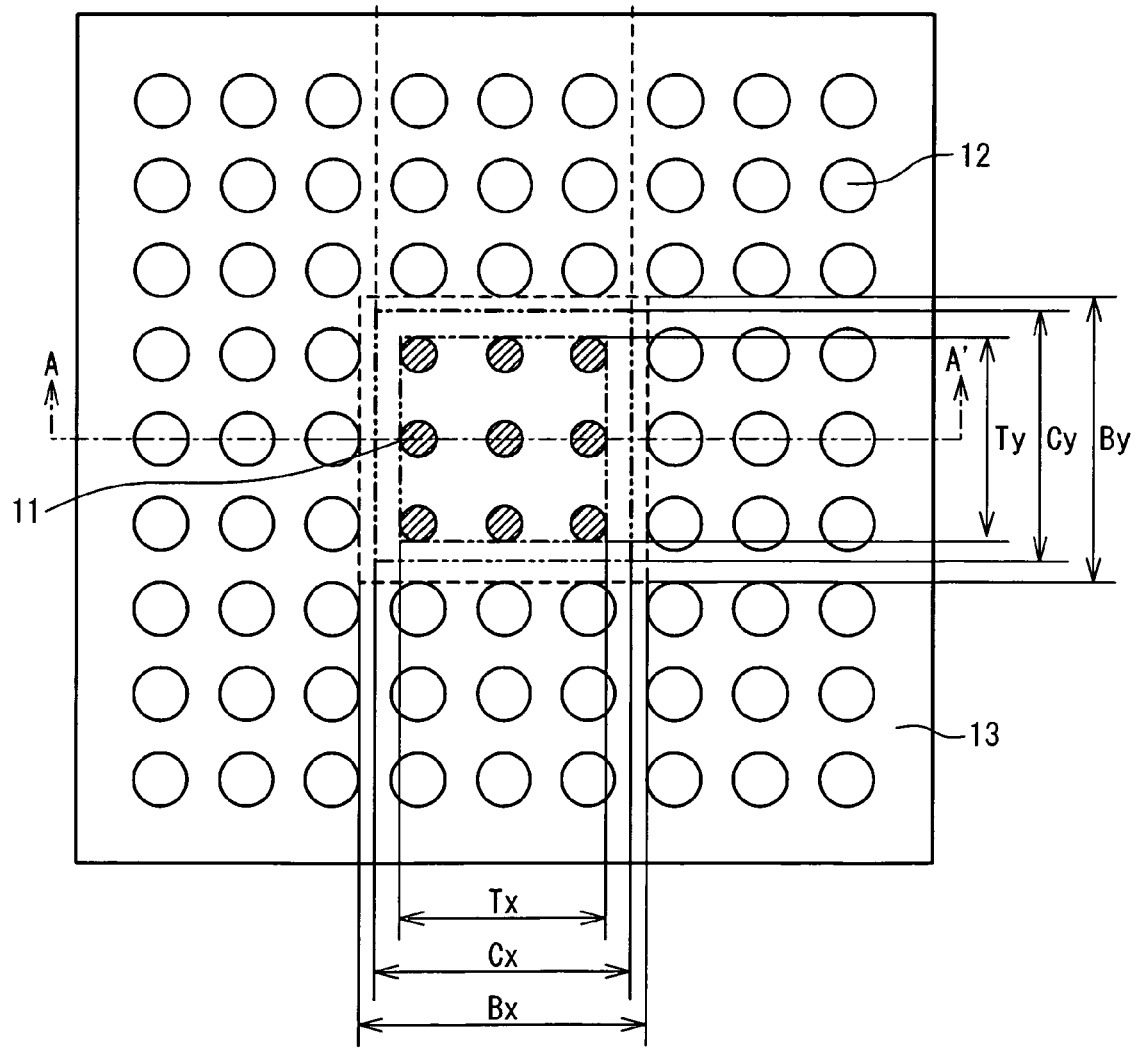
FIG. 11B is a diagram showing a modified example of a bottom view of the semiconductor device according to the ninth embodiment.

FIG. 11B shows a bottom view of a modified example of a semiconductor device according to a ninth embodiment. FIG. 11A shows a cross-sectional view at a cross-section A-A' in FIG. 11B of a modified example of a semiconductor device according to the ninth embodiment. As shown in FIGS. 11A and 11B, the external terminals 11 may be arranged at the same pitch with the external terminals 12, and the opening area of the external terminals 11 may also be the same with the external terminals 12. In this case, it is possible to arrange the external terminals 11 and the external terminals 12 on the same lattice.

Tenth Embodiment

Figure 12A:
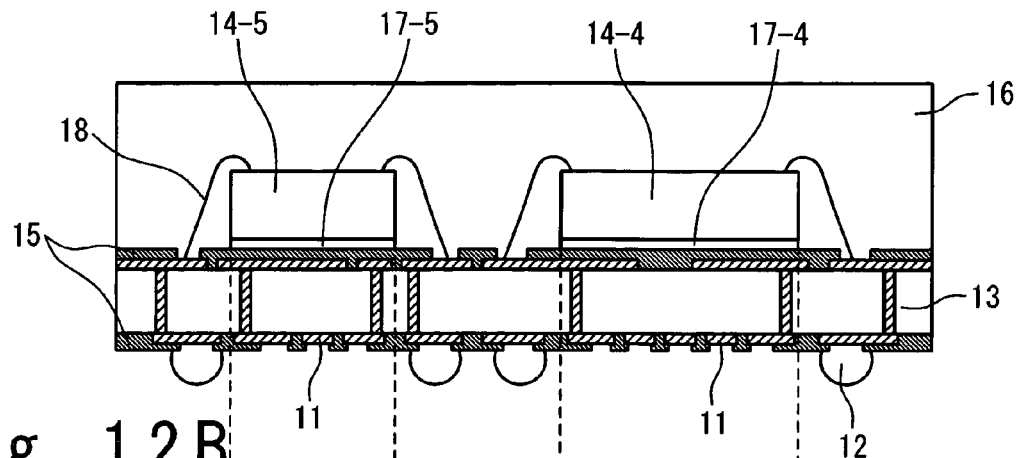
FIG. 12A is a diagram showing a cross-sectional view of a semiconductor device according to a tenth embodiment.
Figure 12B:
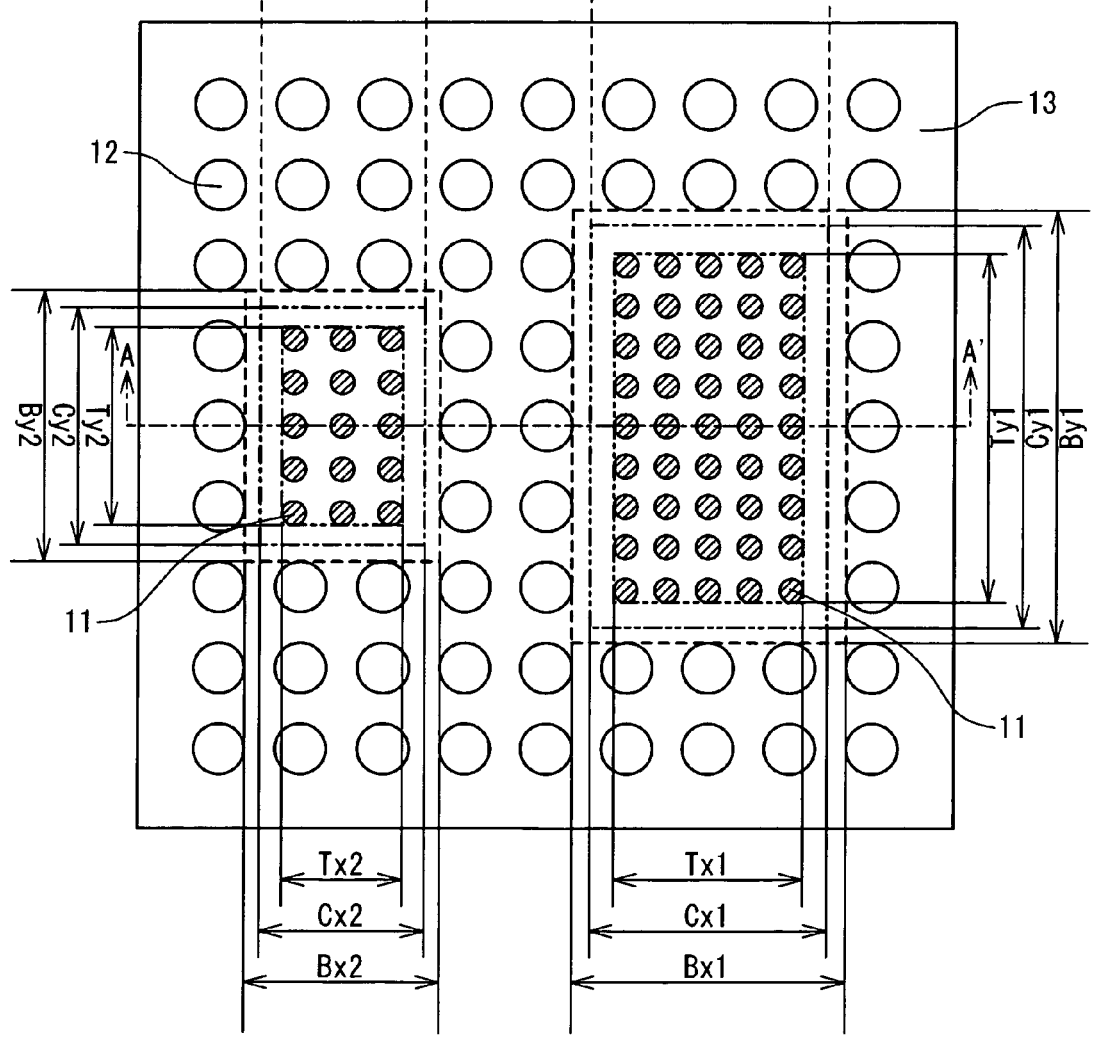
FIG. 12B is a diagram showing a bottom view of a semiconductor device according to the tenth embodiment.

FIG. 12B shows a bottom view of a semiconductor device according to a tenth embodiment. FIG. 12A shows a cross-sectional view at a cross-section A-A' in FIG. 12B of a semiconductor device according to the tenth embodiment. The semiconductor device includes the wiring substrate 13, semiconductor chips 14-4, 14-5, the mold resin 16, the plurality of external terminals 11, and the plurality of external terminals 12. The wiring substrate 13 is provided with wiring by conductors such as copper, which is protected by the solder resist 15 coated on the surface of the wiring.

The external terminals 11 are exposed parts (lands) of the wiring in opening areas of the solder resist 15 where the solder resist 15 is not coated on the wiring. Solder balls are not attached to the external terminals 11. The external terminals 12 include solder balls attached to exposed parts (lands) of the wiring in opening areas of the solder resist 15, and connected to the mounting substrate by the solder balls.

The semiconductor chip 14-4 is attached to the opposite side of the area to arrange the external terminals 11 and 12 on the wiring substrate 13 by means of the die-bonding material 17-4. The semiconductor chip 14-4 is electrically connected to the wiring of the wiring substrate 13 by using the bonding wires 18. The semiconductor chip 14-5 is arranged next to the semiconductor chip 14-4, and attached on the wiring substrate 13 by means of the die-bonding material 17-5. The semiconductor chip 14-5 is electrically connected to the wiring of the wiring substrate 13 by using the bonding wires 18. The mold resin 16 covers and fixes the semiconductor chips 14-4 and 14-5 along with the bonding wires 18 on the wiring substrate 13 for protection.

As shown in FIG. 12B, the plurality of the external terminals 11 without including the solder balls are arranged directly under the semiconductor ships 14-4 and 14-5 in a lattice form. The plurality of the external terminals 12 is arranged so as to surround the outer edge of the external terminals 11. Specifically, it will be expressed as follows. The semiconductor chip 14-4 is mounted to the opposite side of Cx1×Cy1 area on the wiring substrate 13, and the semiconductor chip 14-5 is mounted to the opposite side of Cx2×Cy2 area on the wiring substrate 13. The external terminals 11 located directly under the semiconductor chip 14-4 are arranged in Tx1×Ty1 area, and the external terminals 11 located directly under the semiconductor chip 14-5 are arranged in Tx2×Ty2 area. The external terminals 12 are not arranged in Bx1×By1 area and Bx2×By2 area. The Tx1×Ty1 area to arrange the external terminals 11 is located inside the area in which the external terminals 12 are not arranged (Bx1≧Tx1, By1≧Ty1). There is no external terminals 12 exist directly under the Cx1×Cy1 area to arrange the semiconductor chip 14-4 (Bx1≧Cx1, By1≧Cy1). Moreover, the Tx2×Ty2 area to arrange the external terminals 11 is located inside the area in which the external terminals 12 are not arranged (Bx2≧Tx2, By2≧Ty2). There is no external terminals 12 exist directly under the Cx2×Cy2 area to arrange the semiconductor chip 14-4 (Bx2≧Cx2, By2≧Cy2).

When the semiconductor device is mounted to the mounting substrate, the external terminals 11 which are arranged directly under the semiconductor chips 14-4 and 14-5 are not connected to the mounting substrate. Since the external terminals 12 connect the wiring substrate 13 to the mounting substrate with practically the same thermal expansion coefficient, the external terminals 12 have substantially small stress caused by the thermal expansion.

Since the area of the mounting substrate facing to the area to arrange the external terminals 11 is not connected to the semiconductor device, the user can execute wiring as desired in this area. The external terminals 11 are arranged at a pitch narrower than the pitch to arrange the external terminals 12. The opening area of the external terminals 11 is also smaller than that of the external terminals 12. Accordingly, when the semiconductor device is mounted to the mounting substrate, it is possible to increase the number of the external terminals 11 which are unnecessary to be connected externally.

Figure 13A:
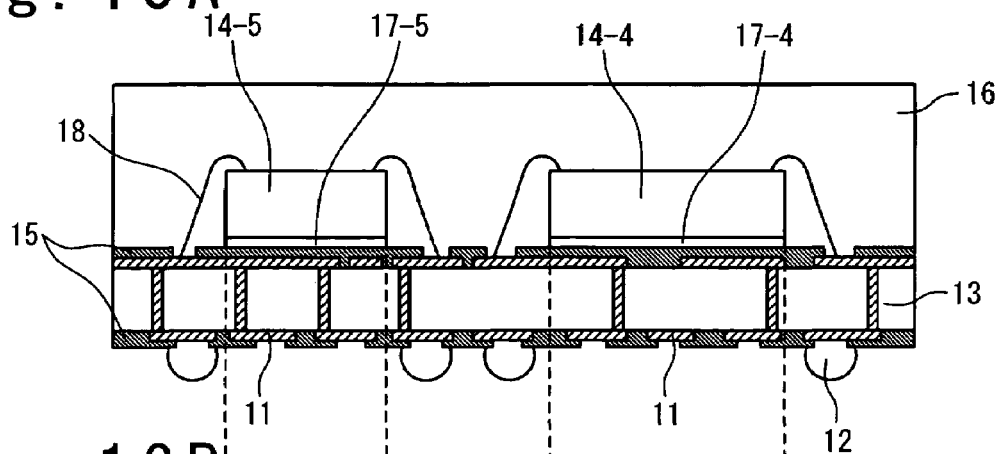
FIG. 13A is a diagram showing a modified example of a cross-sectional view of the semiconductor device according to the tenth embodiment.
Figure 13B:
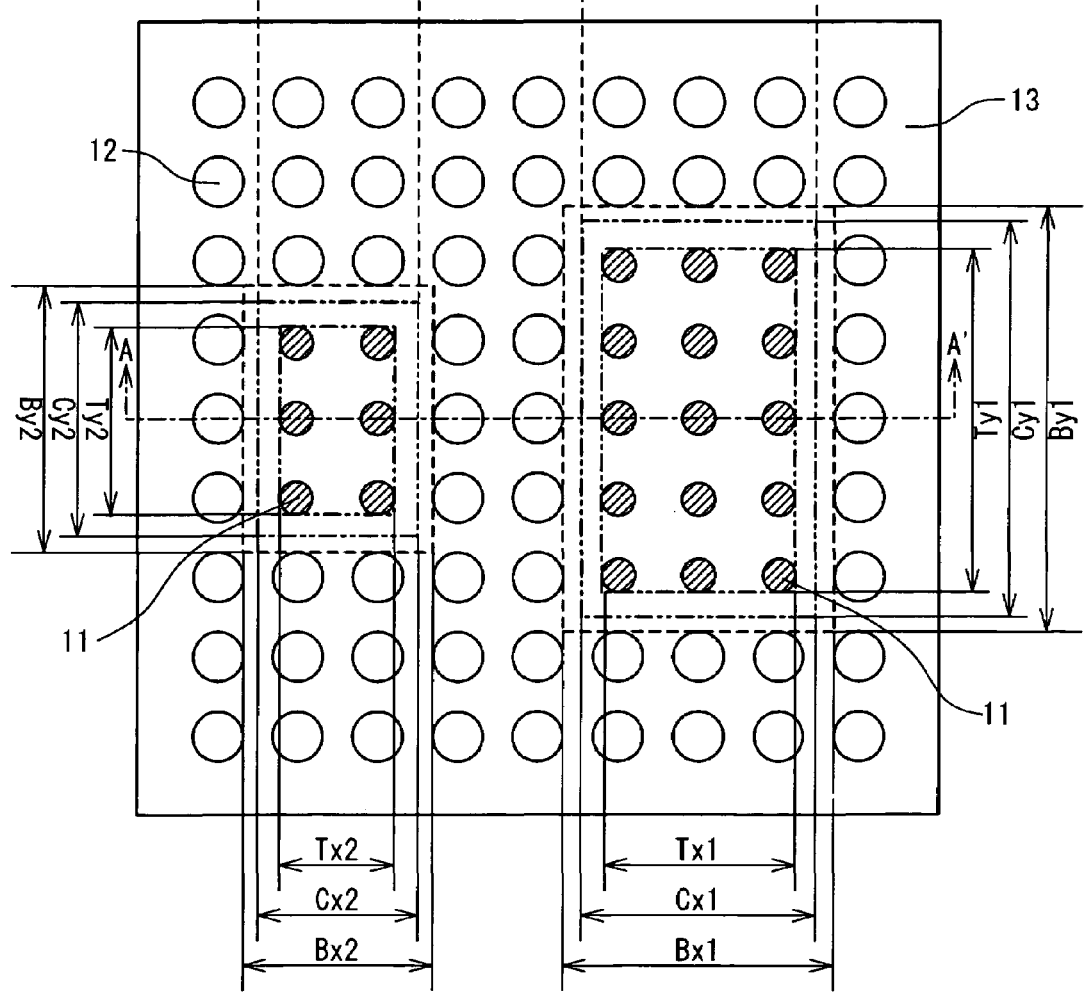
FIG. 13B is a diagram showing a modified example of a bottom view of the semiconductor device according to the tenth embodiment.

FIG. 13B shows a bottom view of a modified example of a semiconductor device according to the tenth embodiment. FIG. 13A shows a cross-sectional view at a cross-section A-A' in FIG. 13B of a modified example of a semiconductor device according to the tenth embodiment. As shown in FIGS. 13A and 13B, the external terminals 11 may be arranged at the same pitch with the external terminals 12, and the opening area of the external terminals 11 may also be the same with the external terminals 12. In this case, it is possible to arrange the external terminals 11 and the external terminals 12 on the same lattice.

Figure 14A:
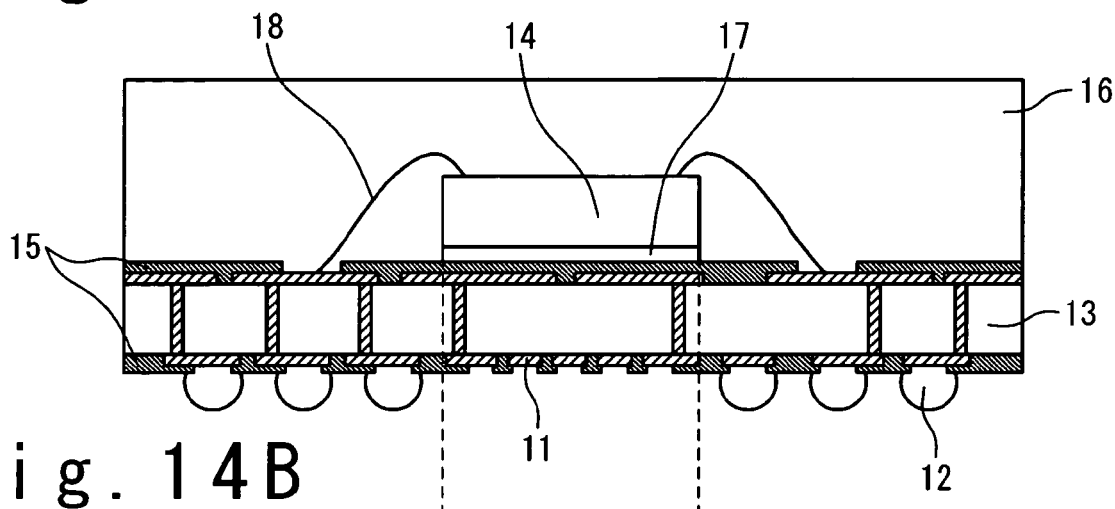
FIG. 14A is a diagram showing an explanatory cross-sectional view of a terminal form.
Figure 14B:
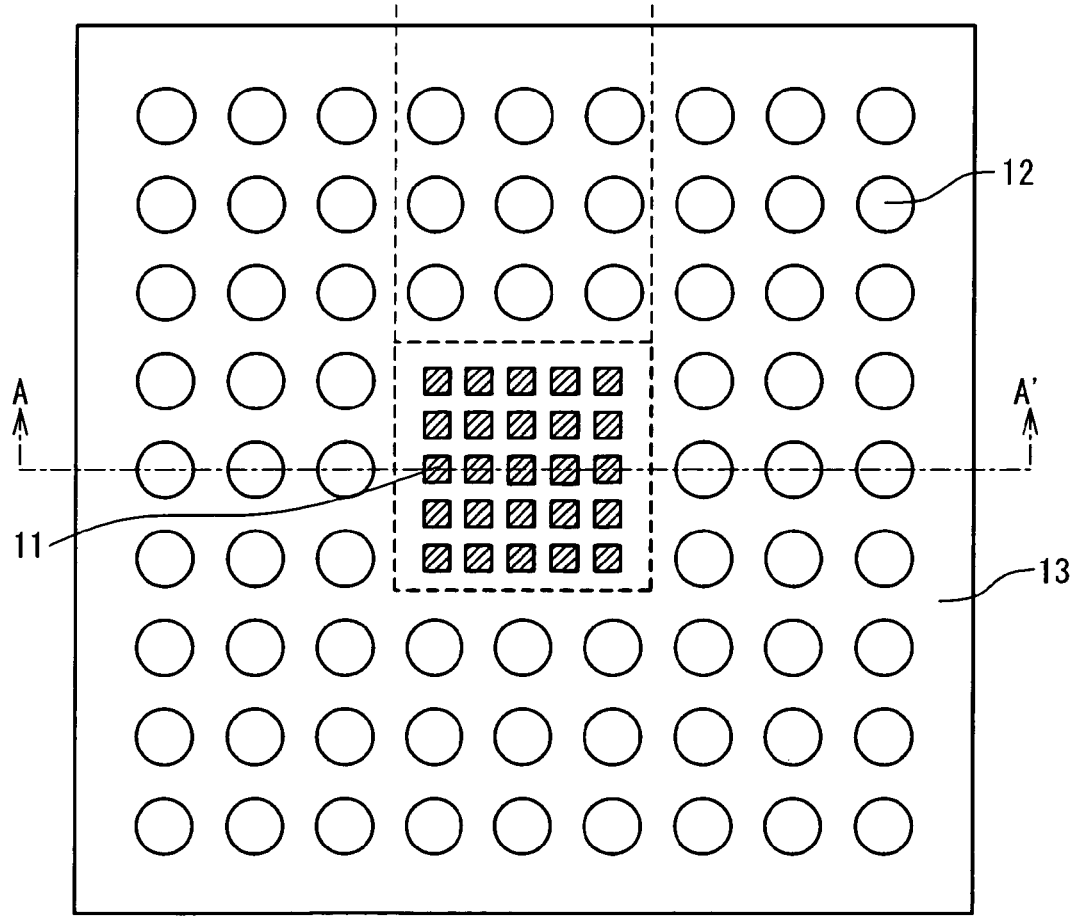
FIG. 14B is a diagram showing an explanatory bottom view of a terminal form.

Although the above explanation is provided on condition that the form of the external terminals 11 (the form of the opening area) is spherical, the form is not necessarily spherical and may be either triangular or polygonal, or rectangular. FIG. 14B shows a bottom view of an example of a semiconductor device according to the present invention. FIG. 14A shows an explanatory cross-sectional view at a cross-section A-A' in FIG. 14B of an example of a semiconductor device according to the present invention. FIGS. 14A and 14B show the rectangular form of the external terminals 11. In the case of the rectangular form, the external terminals 11 will have the largest area.

Each of the lands exposed from the solder resist 15 becomes the external terminal 11 or the external terminal 12 based on whether or not the solder ball is placed on. A manufacturing method of the external terminals 11 and the external terminals 12, for example, includes a method to coat flux to the lands which will be the external terminals 12. This method uses a pin holder-shaped tool which is a kind of a bundle of needles. The flux is set on tips of the needles. The tool is pressed against the semiconductor device so that the flux is attached to the lands which should become a part of the external terminals 12. The solder balls are caused to attach to the lands coated by the flux, thereby the lands become the external terminals 12. The solder balls are not attached to the lands without the flux, thereby the lands become the external terminals 11. A method may also be employed in which the solder balls coated by flux are attached to the position corresponding to the lands to be attached by using the tool to adsorb the solder balls. In the tool, the position to adsorb the solder balls is established in accordance with the position corresponding to the terminals attached to the solder balls. The tool is caused to adsorb the solder balls and pressed against the semiconductor device so that the solder balls coated by the flux are attached to the lands which become the external terminal 12. Since the solder balls are not attached to the external terminals 11, the tool is not affected by the position of the external terminals 11. In the method to adsorb the solder balls, the solder balls may be absorbed first and then coated by the flux.

It should be noted that a method for manufacturing a semiconductor device according to the present invention includes the steps of (A) to (C). The step (A) is a step of providing a semiconductor chip 14 and a wiring substrate 13. The wiring substrate 13 is configured to be electrically connected to the semiconductor chip 14, and have a plurality of external terminals 11, 12 arranged on an surface opposite to a surface on which the semiconductor chip 14 is mounted. The plurality of external terminals 11, 12 includes: a plurality of (first) external terminals 11 configured to be arranged closely to each other, and a plurality of (second) external terminals 12 configured to be arranged so as to surround the plurality of (first) external terminals 11. The step (B) is a step of attaching a plurality of metal balls to the plurality of (second) external terminals 12 by using flux. The metal balls are not attached to the plurality of (first) external terminals 11. The step (C) is a step of mounting the wiring substrate 13 onto a mounting substrate (not shown). Terminals of the semiconductor chip 14 are connected to terminals (not shown) of the mounting substrate through the plurality of (second) external terminals 12.

The method for manufacturing a semiconductor device according to the present invention, the step (B) includes (B1) coating flux on the plurality of (second) external terminals 12. The flux is not coated on the plurality of (first) external terminals 11.

The method for manufacturing a semiconductor device according to the present invention, the step (B) includes (B2) coating flux on the plurality of metal balls to be attached to the plurality of (second) external terminals 12.

As described above, according to the present invention, the external terminals 11 without the solder balls and the external terminals with the solder balls are provided wherein, when the semiconductor device is mounted to the mounting substrate, the external terminals 11 without the solder balls are centralized to enable the increase of the test terminals which are not necessary to be connected to the mounting substrate. The reduction of the stress caused by the thermal expansion can be achieved in the external terminals 12 by establishing the area to arrange the external terminals 11 directly under the semiconductor chip 14.

It is apparent that the present invention is not limited to the above embodiment that may be modified and changed without departing from the scope and spirit of the invention.

What is claimed is:

1. A semiconductor device comprising:
   a semiconductor chip; and
   a wiring substrate, having a mounting surface for mounting said semiconductor chip and a terminal surface having a plurality of wiring terminals, said terminal surface on a side opposite that of said mounting surface, said wiring substrate configured to be electrically connected to said semiconductor chip
   said plurality of wiring terminals comprising:
   a plurality of test terminals configured to be arranged closely to each other, provided such that said semiconductor chip is connectable to an external test device through at least one terminal of said plurality of test terminals during testing of said semiconductor chip; and
   a plurality of non-test terminals arranged apart from said plurality of test terminals provided such that said semiconductor chip is connectable to an external non-test device during normal operation of said semiconductor chip through said plurality of non-test terminals,
   wherein each of said plurality of test terminals is not configured to connect to said test device through a metal ball, while each of said plurality of non-test terminals is configured to connect to said non-test device through a metal ball.

2. The semiconductor device according to claim 1, wherein said each of the plurality of second terminals is arranged in an outside of an backside area corresponding to a mounting area where said semiconductor chip is directly attached to said wiring substrate.

3. The semiconductor device according to claim 1, wherein a pitch among said plurality of first terminals is narrower than that among said plurality of second terminals.

4. The semiconductor device according to claim 1, wherein a size of each of said plurality of first terminals is smaller than that of each of said plurality of second terminals.

5. The semiconductor device according to claim 1, wherein a plurality of semiconductor chips including said semiconductor chip is mounted on said wiring substrate.

6. The semiconductor device according to claim 1, wherein said semiconductor chip is connected to said wiring substrate by wire bonding method.

7. The semiconductor device according to claim 1, wherein said semiconductor chip is connected to said wiring substrate by flip chip bonding method.

8. The semiconductor device according to claim 5, wherein said plurality of semiconductor chips is stacked and mounted on said wiring substrate,
   wherein each of said plurality of second terminals is arranged in an outside of an backside area corresponding to a mounting area where a lowest semiconductor chip, which is the closest to said wiring substrate in said plurality of semiconductor chips, is attached to said wiring substrate.

9. The semiconductor device according to claim 5, wherein each of said plurality of semiconductor chips is directly attached to said wiring substrate,
   wherein each of said plurality of second terminals is arranged in an outside of an backside area corresponding to mounting areas where said plurality of semiconductor chips is attached to said wiring substrate.

10. The semiconductor device according to claim 1, wherein a plurality of semiconductor chips including said semiconductor chip is mounted on said wiring substrate.

11. The semiconductor device according to claim 10, wherein a pitch among said plurality of first terminals is narrower than that among said plurality of second terminals.

12. The semiconductor device according to claim 10, wherein a size of each of said plurality of first terminals is smaller than that of each of said plurality of second terminals.

13. The semiconductor device according to claim 10, wherein said plurality of semiconductor chips is stacked and mounted on said wiring substrate.

14. The semiconductor device according to claim 10, wherein each of said plurality of semiconductor chips is directly attached to said wiring substrate.

15. The semiconductor device according to claim 10, wherein each of said plurality of semiconductor chips is connected to said wiring substrate by wire bonding method.

16. The semiconductor device according to claim 10, wherein each of said plurality of semiconductor chips is connected to said wiring substrate by flip chip bonding method.

* * * * *